United States Patent [19]
Mori et al.

[11] Patent Number: 5,580,809
[45] Date of Patent: Dec. 3, 1996

[54] METHOD OF MAKING A MASK ROM USING TUNNEL CURRENT DETECTION TO STORE DATA

[75] Inventors: Shinichi Mori; Osamu Ueda; Masayuki Yamashita, all of Hyogo-ken, Japan

[73] Assignee: Mitsubishi Denki Kabushiki Kaisha, Tokyo, Japan

[21] Appl. No.: 492,217

[22] Filed: Jun. 19, 1995

Related U.S. Application Data

[62] Division of Ser. No. 245,305, May 17, 1994, Pat. No. 5,464,989, which is a continuation of Ser. No. 832,451, Feb. 7, 1992, abandoned.

[30]      Foreign Application Priority Data

Feb. 19, 1991   [JP]   Japan ..................... 3-24733
Apr. 17, 1991   [JP]   Japan ..................... 3-85486

[51] Int. Cl.[6] ............................................. H01L 21/8246
[52] U.S. Cl. ................................................ 437/48; 437/52
[58] Field of Search ........................... 437/43, 45, 47, 437/48, 52

[56]              References Cited

U.S. PATENT DOCUMENTS

| | | | |
|---|---|---|---|
| 4,096,522 | 6/1978 | Suzuki et al. | 357/45 |
| 4,757,359 | 7/1988 | Chaio et al. | 357/23.5 |
| 5,002,896 | 3/1991 | Naruke | 437/48 |
| 5,147,813 | 9/1992 | Woo | 437/43 |
| 5,149,667 | 9/1992 | Choi | 437/52 |
| 5,156,990 | 10/1992 | Mitchell | 437/43 |
| 5,279,982 | 1/1994 | Crotti | 437/48 |

FOREIGN PATENT DOCUMENTS

| | | |
|---|---|---|
| 399820A2 | 5/1990 | European Pat. Off. . |
| 58-122694 | 7/1983 | Japan . |
| 61-1904 | 1/1986 | Japan . |

OTHER PUBLICATIONS

Engle et al., "Der Festwertspeicher", Funkschau 10, May 1984, pp. 55–62.

Kolodny, "Analysis and Modeling of Floating–Gate EEPROM Cells", IEEE Transcation on Electron Devices, vol. ED–33, No. 6, Jun. 1986, pp. 835–844.

"Submicron Devices II", Electronic Material Series, pp. 27–34, Jan. 1988.

*Primary Examiner*—George Fourson
*Assistant Examiner*—Richard A. Booth
*Attorney, Agent, or Firm*—Lowe, Price, LeBlanc & Becker

[57]                ABSTRACT

Each of the portions corresponding to the crossings of a plurality of first strip conductive layers serving as bit lines and a plurality of second strip conductive layers serving as word lines crossing the conductive layers at right angles is used as one memory cell. An oxide film is provided between the first strip conductive layers and the second strip conductive layers. The thickness of this oxide film is set in each memory cell according to stored data. Also a multi-value memory can be realized, since the amount of stored data in each memory cell is an arbitrary amount of 1 bit or more by making the stored data of a plurality of types of memory cells having different thicknesses in the tunnel oxide film 15 correspond to a plurality of different data. The size of each memory cell can be reduced since the occupying area of each memory cell on the semiconductor substrate is dependent on the width of the first strip conductive layer and the second strip conductive layer. An insulation film in which tunnel phenomenon is generated can be formed using conventional manufacturing technology.

14 Claims, 21 Drawing Sheets

| CORRESPONDING BIT LINE | | GROUND | | FLOATING | |
|---|---|---|---|---|---|
| CORRESPONDING WORD LINE | | VL | VH | VL | VH |
| CURRENT FLOWING TO CORRESPONDING BIT LINE | MEMORY CELL 5a | 0 | SEVERAL 10 μA | 0 | 0 |
| | MEMORY CELL 5b | 0 | 0 | 0 | 0 |

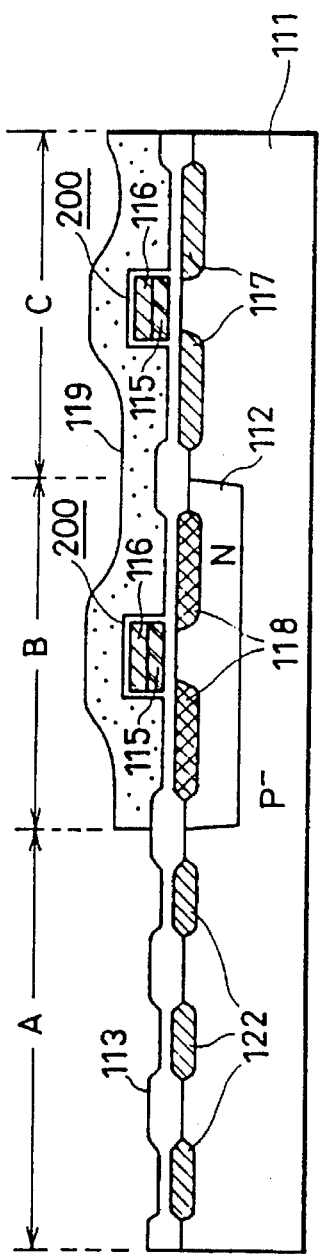
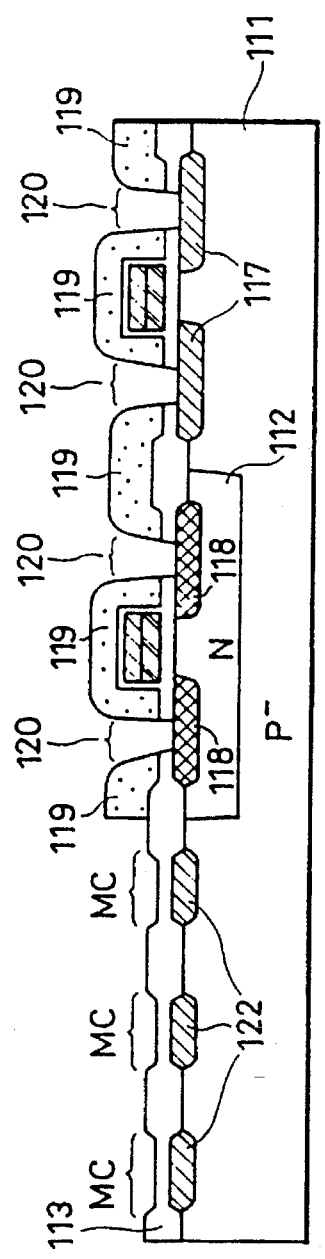
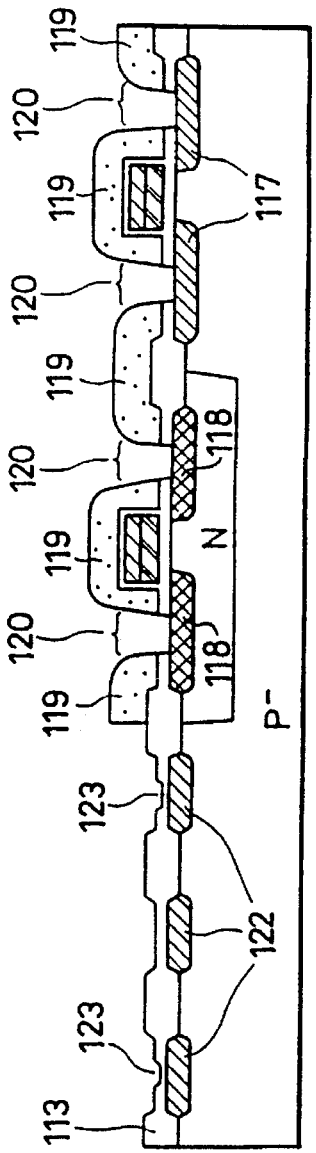
FIG. 6(a)
FIG. 6(b)
FIG. 6(c)

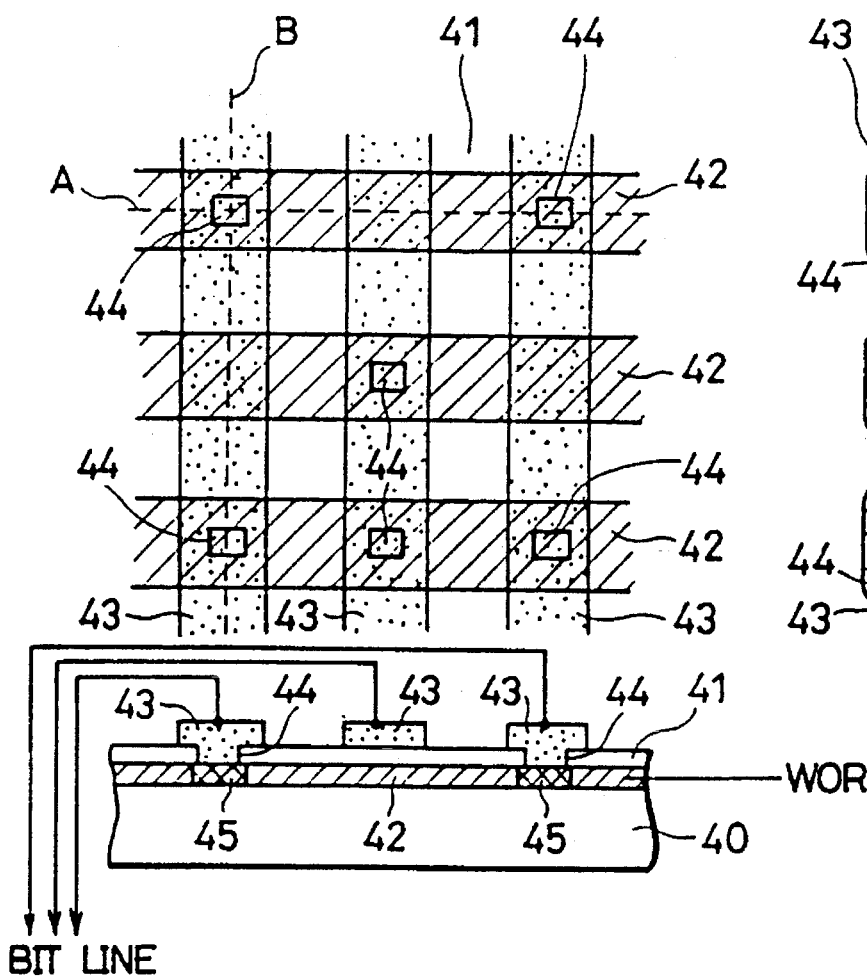
FIG. 12(a) PRIOR ART
FIG. 12(b) PRIOR ART
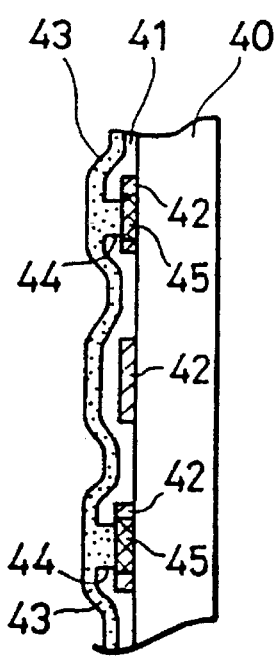
FIG. 12(c) PRIOR ART FIG.18A
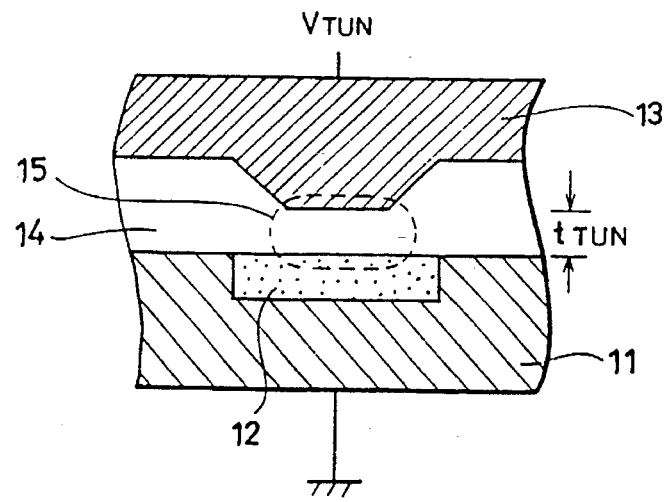
FIG.18B  FIG.18C
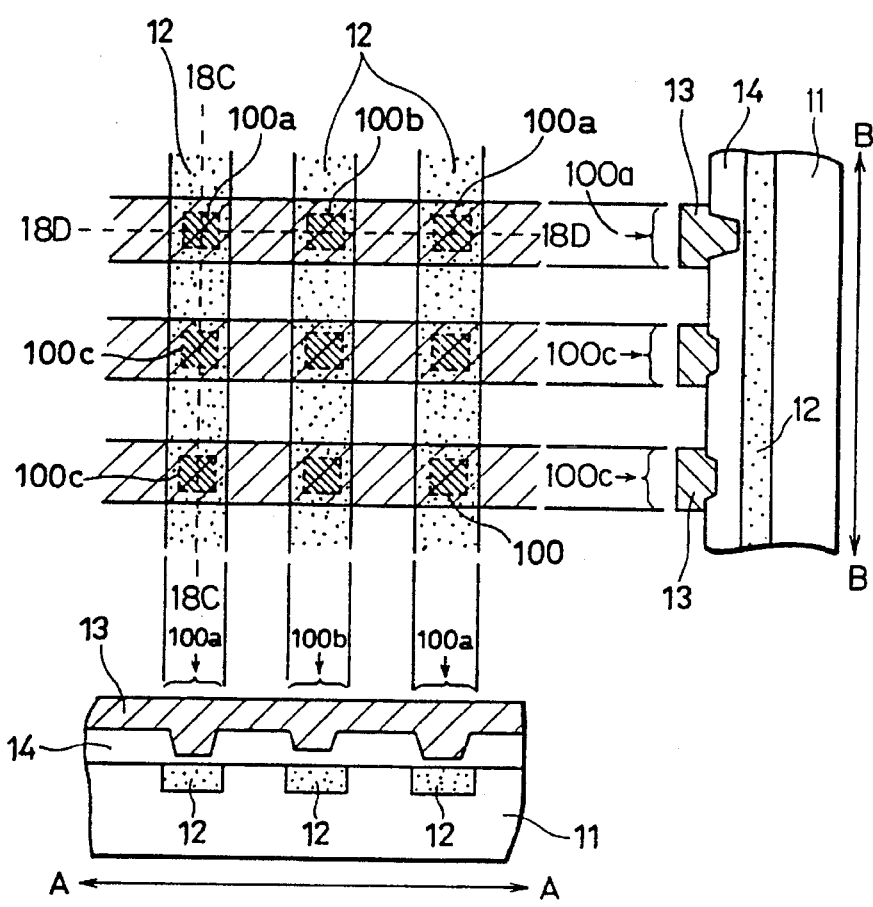
FIG.18D

METHOD OF MAKING A MASK ROM USING TUNNEL CURRENT DETECTION TO STORE DATA

This application is a division of application Ser. No. 08/245,305 filed May 17, 1994 now U.S. Pat. No. 5,464,989 which is a continuation of application Ser. No. 07/832,451 now abandoned, filed Feb. 7, 1992.

BACKGROUND OF THE INVENTION

1. Field of the Invention

The present invention relates to mask ROMs and the method of manufacturing thereof, and more particularly, to a mask ROM advantageous to larger memory capacity, and the method of manufacturing thereof.

2. Description of the Background Art

The memory ICs used today are typically classified according to its writing characteristic into a RWM (read write memory) that can read out and be written freely after manufacturing, and a ROM (read only memory) that cannot be written and is used exclusively for reading after manufacturing. ROMs are used for storing fixed information such as character patterns because the stored information is nonvolatile, i.e. does not disappear, and remains even after power supply is cut off. ROMs can further be classified into an EPROM (Erasable and Programmable ROM) that can have the stored information electrically modified and erased by ultraviolet light irradiation after manufacturing, and a mask ROM that can not have the stored information that is written during the manufacturing step modified after manufacturing. Mask ROMs are widely used for storing fixed data such as the character patterns of CRT displays and BASIC programs of personal computers.

The memory array portion of a mask ROM available in the market includes a MOS transistor arranged in a matrix. Such a MOS transistor is used as a memory cell. In forming a MOS transistor on a semiconductor substrate, three regions of source/drain and gate are required. The size of these three regions must be sufficient to realize the function as a MOS transistor, and thus cannot be minimized without restriction. Contrary to the request for minimization of semiconductor integrated circuit devices, there was a limit in reducing the area size of the entire memory array. This became a serious problem as the storage capacity of a mask ROM increased. The need of large storage capacity of a memory IC including a mask ROM is drastically growing these years. Therefore, a mask ROM satisfying the contradicting requirements of miniaturization of various semiconductor integrated circuit devices including a memory IC and of increase in the memory capacity of a memory IC are now being studied from both the standpoints of miniaturization of each memory cell and increase in the number of bits of information stored in each memory cell.

A mask ROM devised from the standpoint of miniaturization of each memory cell will first be explained.

According to such an improved mask ROM, an element of diode structure is used as a memory cell in place of an element of a MOS transistor structure.

FIG. 12 is a diagram showing a memory array structure of such an improved mask ROM disclosed in Japanese Patent Publication No. 61-1904. FIG. 12(a) is a plan view, and FIGS. 12(b) and (c) are sectional views taken along broken lines A and B, respectively, of the memory cell array of FIG. 12(a). Referring to FIG. 12, this memory cell array is formed on a semiconductor substrate 40 of monocrystal silicon. Substrate 40 has an insulation film (not shown) formed of silicon oxide film on the surface. A plurality of strips of N type polysilicon layers 42 are provided in parallel with each other on substrate 40. An insulation layer 41 is provided all over semiconductor substrate 40 and polysilicon layers 42. Insulation layer 41 is selectively provided with an opening, i.e. a contact hole 44. A P type polysilicon region 45 is formed by introducing impurities into polysilicon layer 42 under contact hole 44. A plurality of parallel strips of conductive layers 43 are provided on insulation layer 41 and contact hole 44 to cross polysilicon layer 42. Contact hole 44 is selectively provided at the crossing of polysilicon layer 42 and conductive layer 43. Each strip polysilicon layer 42 corresponds to a different word line. Each strip conductive layer 43 corresponds to a different bit line.

It can be seen from FIG. 12(a) that the crossings of a plurality of strip polysilicon layers 42 and a plurality of strip conductive layers 43 form a matrix. Referring to FIGS. 12(b) and (c), a PN junction is formed in polysilicon layer 42 beneath each contact hole 44. If forward voltage is applied to conductive layer 43 at the crossing having contact hole 44, current flows to polysilicon layer 42. The application of forward voltage to conductive layer 43 at the crossing not having contact hole 44 causes no current to flow to polysilicon layer 42 because conductive layer 43 is insulated from polysilicon layer 42 by insulation layer 41. By applying a predetermined voltage to a selected bit line and selecting a word line to detect the presence of current flowing thereof, determination can be made whether a contact hole is provided or not at the crossing of conductive layer 43 corresponding to the selected bit line and polysilicon layer 42 corresponding to the selected word line. It is therefore possible to conventionally read out stored information from a manufactured mask ROM by making the presence and absence of a contact hole correspond to logic values 1 and 0, and determine a formation pattern of contact holes according to the information to be stored in a mask ROM. Instead of the conventional usage of 1 MOS transistor as 1 memory cell, simply one PN junction, i.e. one diode is used. Therefore, the area necessary for one memory cell depends on the widths of conductive layer 43 and polysilicon layer 42.

The minimum values of the width of each conductive layer 43 and each polysilicon layer 42 are determined by the limit value of line-and-space in the current manufacturing techniques. By reducing these widths (within the range where a contact hole 44 can be formed), the area of one memory cell occupying the face of the substrate can be reduced significantly. Thus, a much smaller mask ROM can be obtained in comparison with the case where a MOS transistor is used as a memory cell.

The manufacturing steps of a mask ROM having a memory cell array of FIG. 12 will be explained with reference to FIGS. 13–15. FIGS. 13–15 are sectional views of a mask ROM showing an example of the manufacturing steps.

Referring to FIG. 13(a), N type impurities are selectively diffused onto the main surface of a P type substrate 111 having a low impurity concentration to form an island-like N well region 112. Then, an oxide film 113 is formed on the main surface of substrate 111 including N well region 112 (FIG. 13(b)). Oxide film 113 is thickly formed at the relative boundary portions of memory cell array region A, P channel MOS transistor region B forming the periphery of memory cell array region A, and N channel MOS transistor region C to serve as an oxide film for element isolation, and thinly in each regions of A, B and C so as not to degrade the transmittance of the impurities. Next, a conductive layer 114 corresponding to N type polysilicon layer 42 of FIG. 12 is formed on the main surface of substrate 111 corresponding to memory cell array region A. Conductive layer 114 is provided as a plurality of strip-like conductive layers vertical to the plane of the drawing sheet to form the word lines (FIG. 13(c)).

Then, a conductive layer of polysilicon layer 115 and metal layer 116 is formed on the main surface of substrate 111, as shown in FIG. 14(a), as the gate electrode and the interconnection layer in the respective P channel MOS transistor region B and N channel MOS transistor region C. Next, an oxide film 113 for insulation is again formed on the main surface of substrate 111. Referring to FIG. 14(b), an opening 201 is selectively provided in oxide film 113 and a resist 202 layered thereupon, in memory cell array region A. A P type polysilicon region 203 is formed by introducing P type impurities into polysilicon layer 114 at the bottom of opening 201. An N type region 17 forming the source and drain is formed in N channel MOS transistor region C by selectively diffusing N type impurities onto the main surface of substrate 111. A P type region 118 which is the source and drain of the P channel MOS transistor is formed by selectively diffusing P type impurities onto N well 112 (FIG. 14(c)). Then, an insulation film 119 is formed all over the main surface of substrate 111 to fill and make planar the entire surface of substrate 111. Referring to FIG. 14(d), a contact hole 120 is selectively formed in the insulation layer of insulation film 119 and oxide film 113. Contact hole 120 is formed to expose the surfaces of P type polysilicon region 203, N type region 117, and P type region 118 in memory cell array region A, N channel MOS transistor region C, and P channel MOS transistor region B, respectively.

Referring to FIG. 15, a conductive layer 121 of metal such as aluminum is selectively formed over insulation film 119 to fill contact hole 120. In memory cell array region A, a plurality of strips of conductive layers 121 are provided on insulation film 119 at right angles to each N-type polysilicon layer 114 forming a word line. Each of the plurality of conductive layers 121 corresponds to one bit line. In peripheral regions B and C, conductive layer 121 form an interconnection connected to the source/drain of a MOS transistor.

In a mask ROM manufactured in the above manner, positive voltage is applied only to conductive layer 121 forming a word line which corresponds to a MC required to have data read out, whereby the presence of current is sensed flowing through conductive layer 114 forming a bit line which corresponds to the memory cell MC. Determination is made whether the logic value of the stored data in the memory cell MC is 0 or 1 according to the sensed result. If there is a PN junction formed of P type region 117 and N type region 114 in the memory cell MC, the state of this PN junction becomes forward bias in response to the application of voltage to conductive layer 121 which is the bit line to cause current to flow to the corresponding conductive layer 114 forming a word line. Although the selected word line may comprise contact hole 120 in the crossing portion with other bit lines that are not selected, there is no possibility of the current in word line 114 to flow out to other bit lines that are not selected since the PN junction in each contact hole 120 attains a reverse-bias state. If there is no PN junction in memory cell MC, current will not flow to that memory cell MC since there is no contact hole 120 between that memory cell and the corresponding bit line.

At the locations corresponding to the crossings of a plurality of first strip conductive layers each forming one word line and a plurality of second strip conductive layers each forming one bit line provided at right angles to the first conductive layers in the above-described mask ROM advantageous to high integration density, a PN junction is selectively provided to electrically connect the first conductive layer and the second conductive layer. Each crossing functions as one memory cell. Although such a mask ROM is advantageous to high integration density since memory cells can be reduced in size, the manufacturing process thereof is not so simple since it is necessary to selectively form PN junctions. Many mask ROMs using a memory cell of a simple structure advantageous to high integration density which completely differ from mask ROMs which are currently available in the market include the above-described mask ROM having one memory cell formed by one PN junction.

Each of FIGS. 20 and 22A is a sectional views of a memory cell in a conventional mask ROM devised from the standpoint of increasing the number of data bits stored in a memory cell.

FIG. 20 shows a semiconductor memory device of a multi-value level method for storing a plurality of bits of information in each memory cell having a memory cell structure of a conventional mask ROM where one memory cell is formed by one MOS transistor.

Referring to FIG. 20, each memory cell comprises impurity diffusion layers 32a and 32b having a polarity opposite to that of a semiconductor substrate 31 and formed on semiconductor substrates 31 as a source and drain, and a gate electrode 33 extending over impurity diffusion layers 32a and 32b and formed above semiconductor substrate 31 with an insulation film 34 therebetween. Semiconductor substrate 31 is a P$^-$ type semiconductor substrate of low impurity concentration. Gate electrode 33 is formed of, for example, polysilicon and the like. Differing from the case of a conventional mask ROM storing one bit of data, impurities of a polarity identical to that of the impurities added to drain 32a and source 32b are added by ion implantation and the like at a concentration according to the data to be stored in that memory cell to the region between source 32b and drain 32a at the surface of semiconductor substrates 31, i.e. channel region 35 in each memory cell. The concentration of the impurities added to the channel region 35 of the memory cells forming one memory array is set to a plurality of values.

The threshold voltage of the MOS transistor increases in proportion to the gate voltage required to generate an inverted layer which has a polarity that is opposite to that of semiconductor substrate 31 on channel region 35. The electrical polarity of channel region 35 comes near to that of source 32b and drain 32a as the impurity concentration in channel region 35 rises. Therefore, an inverted layer is generated in channel region 35 even though the applied voltage of positive polarity (in the case where semiconductor substrate 31 is P type) or negative polarity (in the case where semiconductor substrate 31 is N type) towards gate electrode 33 is not so great. The electrical characteristic of a MOS transistor forming the memory cells included in one memory array can be set to a plurality of types by changing the impurity concentration applied to channel region 35 for each memory cell.

More specifically, if there are m types of impurity concentrations applied to channel region 35, the memory cells included in one memory array is divided into a first memory cell group having the lowest threshold voltage due to channel region 35 having the highest impurity concentration, a second memory cell group having a threshold voltage higher than that of the first memory cell group due to channel region 35 having an impurity concentration lower than that of the first memory cell group, . . . , and a m-th memory cell group having the highest threshold voltage due to channel region 35 having the lowest impurity concentration.

FIG. 21 is a graph showing the relationship between the gate potential and the current Ids across drain 32a and 32b of a MOS transistor having a threshold voltage of $V_{TH1}$ (curve 41), a MOS transistor having a threshold voltage of $V_{TH2}$ (curve 42) which is higher than threshold voltage $V_{TH1}$, a MOS transistor having a threshold voltage of $V_{TH3}$ (curve 43) which is further higher than threshold voltage $V_{TH2}$, and a MOS transistor having a threshold voltage of $V_{TH4}$ (curve 44) which is higher than threshold voltage $V_{TH3}$. FIG. 21 shows the case where drain 32a and source 32b are 5 V and 0 V, respectively.

Referring to curves 41–44, a MOS transistor has a behavior according to an enhancement type as the impurity concentration of channel region 35 decreases, and a behavior according to a depletion type as the impurity concentration increases regarding its electrical characteristics. Therefore, if the same potential of V0b is set for the gate potential $V_G$ of the four types of MOS transistors, current Ids across drain 32a and source 32b shows the largest value of I1 in the MOS transistor having threshold voltage $V_{TH1}$, a value of I2 which is smaller than I1 in the MOS transistor having threshold voltage $V_{TH2}$, a value of I3 which is smaller than I2 in the MOS transistor having threshold voltage $V_{TH3}$, and a value of 0 in the MOS transistor having threshold voltage $V_{TH4}$. In other words, the current Ids across drain 32a and source 32b differs among the four types of MOS transistors. It is therefore possible to realize a mask ROM that has two bits of information previously stored in one memory cell by making the stored data of the four types of MOS transistors correspond to four different types of data according to currents of I1, I2, I3, and 0 when the gate potential $V_G$, the drain 32a potential, and the source 32b potential are respectively V0b, 5 V, and 0 V.

By setting the potentials of drain 32a, source 32b and gate 33 of the memory cell desired to have the stored data read out to 5 V, 0 V, and V0b, respectively, and detecting the magnitude of current Ids across drain 32a and source 32b, the stored data of this memory cell is determined by the result corresponding to one of the above mentioned four different types of data.

Such a multi-value memory not using the memory cell structure of a conventional mask ROM is disclosed in Japanese Patent Laying-Open No. 58-122694.

FIG. 22A is a sectional view of a memory cell structure in a multi-value memory disclosed in Japanese Patent Laying-Open No. 58-122694. FIG. 23 is a graph showing the electrical characteristics of a memory cell having the structure shown in FIG. 22A.

FIG. 22B is a plan view of this memory cell array of multi-value memory. It can be appreciated from FIG. 22B that there are a plurality of strips of electrode conductors 51 crossing a plurality of strips of electrode conductors 53. Each crossing point 500 of the plurality of electrode conductors 51 and 53 is used as one memory cell. FIG. 22A shows the sectional view of a memory cell corresponding to one of crossing points 500.

Referring to FIG. 22A, each memory cell comprises an electrode conductor 51 formed of aluminum, an insulator 52 formed on electrode conductor 51, and an electrode conductor 53 formed of Pb on insulator 52. Insulator 52 is formed of $AL_2O_5$. An additive substance 54 such as benzene and benzoic acid is added according to the stored data of the memory cell at the interface of insulator 52 and electrode conductor 53.

Referring to FIG. 23, the increase of voltage V applied between electrode conductors 51 and 53 to a level $V_T$ corresponding to an energy of exciting mode particular to additive substance 54 causes a sudden increase of current I flowing between electrode conductors 51 and 53 due to inelastic tunnel effect. Voltage $V_T$ is, for example, 0.36 V when additive substance 54 is benzene, and 0.4 V when benzoic acid. The sudden increasing level $V_T$ of current I between electrode conductors 51 and 53 differs according to the type of substance 54 added to the interface of insulator 52 and electrode conductor 53. If an additive substance 54 is not added to the interface of insulator 52 and electrode conductor 53, such a non-elastic tunnel effect does not occur so that current I will not suddenly increase even if the applied voltage to electrode conductors 51 and 53 is raised.

Therefore, by detecting the increasing rate dI/dV of current I across electrode conductors 51 and 53 to applied voltage V between electrode conductors 51 and 53, the existence and the type of the additive substance between insulator 52 and electrode conductor 53 of the memory cell can be identified according to the presence of sudden increasing point $V_T$ of current I and the magnitude of voltage V at this sudden increasing point $V_T$. A plurality of bit data can be stored in one memory cell by establishing two or more types of substances used as additive substance 54.

For example, if two types of additive substance 54 of benzene and benzoic acid are used, one memory cell array comprises three types of memory cells of: (1) a memory cell not having additive substance 54 added, (2) a memory cell having benzene added as additive substance 54, and (3) a memory cell having benzoic acid added as additive substance 54. The stored data of these three types of memory cells can be made to correspond to three types of data according to the presence/absence and type of additive substance 54 in the interface of insulator 52 and electrode conductor 53. By detecting the increasing rate dI/dV in each memory cell, the stored data of each memory cell can be identified which of the three types of data it represents according to the presence of sudden increasing point $V_T$ of current I and voltage V between electrode conductors 51 and 53 at the sudden increasing point $V_T$. Because the application of two or more types of substances as additive substance 54 to the interface of insulator 52 and electrode conductor 53 of FIG. 22A results in two or more points of sudden increase in current across electrode conductors 51 and 53, two or more bits of information can be stored at the location corresponding to each of the interconnections of electrode conductors 51 and 53 to implement a multi-value memory.

Such a conventional multi-value memory is realized by using the advantages that the magnitude of current across the drain and source of a MOS transistor is variable by the impurity concentration at the channel region, and that the increasing point due to non-elastic tunnel effect of current flowing across two conductors sandwiching an insulator is variable according to the types of substances added to the interface of the insulator and one of the two conductors. Such a conventional multi-value memory has problems which will be described hereinafter.

The structure of each memory cell takes a field effect transistor type such as that shown in FIG. 20 when a plurality of bits of data are stored in one memory cell by setting in stages impurity concentrations in the channel region. Each memory cell requires regions corresponding to the gate, the drain, and the source on a semiconductor substrate. Therefore, although the amount of information that can be stored in each memory can be increased, there is a limit in increasing the integration density of a memory device since the number of memory cells formed on one chip cannot be reduced considerably. There is also a disadvantage that the step of ion implantation towards channel region 35 is complicated because it is necessary to provide more than two different impurity concentrations for channel region 35 in the memory cells on one chip.

The multi-value memory (refer to FIG. 22) utilizing non-elastic tunnel effect has the area necessary for each memory cell dependent on the width of conductors 51 and 53, since each intersection 500 of strips of conductors 51 and 53 sandwiching insulator 52 is used as one memory cell. By reducing the width of conductors 51 and 53, the occupying area of each memory cell can be significantly reduced than that in the case where a MOS transistor is used as each memory cell. Therefore, such a multi-value memory is superior than the above-described multi-value memory from the standpoint of increase in integration density of a memory device. However, a plurality of types of memory cells having different types of additive substances 54 added to the interface of insulator 52 and conductor 53, and one not having additive substance 54 added, must be provided. This means that additive substance 54 must be selectively added to the interface of insulator 52 and conductor 53. The number of types of substances added to the interface of insulator 52 and conductor 53 must be increased in proportion to the number of bits of information stored in one memory cell, so that the manufacturing step of adding additive substance 54 to the interface becomes complicated.

SUMMARY OF THE INVENTION

An object of the present invention is to provide a mask ROM advantageous to larger memory capacity.

Another object of the present invention is to provide a mask ROM that is easy to manufacture and advantageous to larger memory capacity.

A further object of the present invention is to provide a mask ROM having a simple structure of a memory cell.

A still further object of the present invention is to provide a mask ROM that can be obtained with simple manufacturing steps.

Yet another object of the present invention is to provide a mask ROM in which each memory cell does not include a PN junction.

An additional object of the present invention is to provide a mask ROM in which each memory cell does not include a PN junction and that has a simple structure.

Yet a still further object of the present invention is to provide a mask ROM of large capacity that improves integration density of memory cells on the chip, and increases the amount of information stored in one memory cell.

To achieve the above objects, a mask ROM according to the present invention includes: a semiconductor substrate having a main surface; a plurality of first signal lines formed laterally spaced on the main surface; an insulation film formed on the plurality of first signal lines, each portion having its thickness controlled according to the data to be stored in the mask ROM; and a plurality of second signal lines laterally spaced on the insulation film, crossing said first signal lines at respective crossovers. The selection of the crossings having the first thickness out of the crossings of the plurality of first signal lines and the plurality of second signal lines is determined according to the data to be stored in the mask ROM. The insulation film has predetermined first and second thicknesses at the crossovers. For example, the first thickness enables the generation of tunnel phenomenon while the second thickness disables the generation of tunnel phenomenon.

To achieve the above objects, a method of manufacturing a mask ROM according to the present invention includes the steps of forming a plurality of first strip conductive layers laterally spaced on the main surface of the semiconductor substrate, forming an insulation layer on the first strip conductive layers, and forming a plurality of second strip conductive layers on the plurality of first strip conductive layers. The plurality of second strip conductive layers are arranged laterally spaced to cross each of the plurality of first strip conductive layers. The step of forming the insulation film further includes the step of forming the thickness of the locations in the insulation layer corresponding to the crossings of the plurality of the first and second strip conductive layers that can generate or not generate tunnel phenomenon according to the data to be stored in the mask ROM.

According to another aspect of the present invention, a mask ROM for storing data includes a semiconductor substrate having a major surface, a plurality of parallel first signal lines extending in a column direction on the major surface of said substrate, an insulation film formed on the first signal lines, and a plurality of parallel second signal lines extending in a row direction on the insulation film, crossing the first signal lines at a plurality of crossovers. The insulation film has predetermined first and second thicknesses at the crossovers corresponding to the data, and a predetermined voltage predetermined to cause a first tunnel current through the insulation film at crossovers of the first thickness and to cause a second tunnel current through the insulation film at crossovers of the second thickness. The mask ROM further includes a sense amplifier responsive to a current in the first signal lines for detecting the first and second tunnel currents and, in response, supplying a data output signal.

According to a further aspect of the present invention, a mask ROM includes a semiconductor substrate having a major surface, a plurality of first strip conductive layers formed with distances therebetween on the major surface, an insulation film formed on the plurality of first strip conductive layers and having the film thickness controlled according to the data to be stored in the mask ROM, and a plurality of second strip conductive layers formed on the insulation film. The plurality of second strip conductive layers are arranged laterally spaced and to cross each of the plurality of first strip conductive layers. The insulation film has a thickness of a predetermined plurality of types including at least two types of thickness that can generate tunnel phenomenon in each portion corresponding to the crossovers of the plurality of first strip conductive layers and the plurality of second strip conductive layers.

According to a still further aspect of the present invention, a method of manufacturing a mask ROM comprises the steps of forming an insulation film on the main surface of a semiconductor substrate, forming a plurality of first strip conductive layers laterally spaced by selectively implanting impurities onto the main surface of the semiconductor substrate via the insulation film, and forming a plurality of second strip conductive layers laterally spaced on the insulation film to cross each of the plurality of first strip conductive layers.

The step of forming the insulation film further includes the step of forming the thickness of the locations in the insulation film corresponding to the crossings of the plurality of the first and second strip conductive layers to generate or not generate tunnel phenomenon according to the data.

Preferably, the steps of forming the thickness of the insulation film includes the steps of providing a plurality of openings in any of the locations corresponding to the crossings in the formed insulation film to expose corresponding ones of the plurality of first strip conductive layers, and oxidizing the surface of the exposed portion of the plurality of first strip conductive layers. Alternatively, the step of forming the thickness of the insulation film includes the step of etching any of the portions corresponding to the crossings of the formed silicon oxide film to a thickness that can generate tunnel phenomenon.

A mask ROM and a method of manufacturing thereof according to the present invention of the above described structure can store data of 1 bit in each crossing of the plurality of first strip conductive layers forming first signal lines and the plurality of second strip conductive layers forming second signal lines, by making one of the binary data 0 and 1 correspond to the insulation film having a thickness in which tunnel phenomenon can be generated, and the other correspond to the insulation film having the thickness in which tunnel phenomenon cannot be generated. In other words, each of these crossings implement one memory cell. By applying high voltage between one of the first strip conductive layers and one of the second strip conductive layers, tunnel current will flow across the aforementioned one first strip conductive layer and one second strip conductive layer only in the case where the thickness of the insulation layer at the crossing of the one first strip conductive layer and the one second strip conductive layer can generate tunnel phenomenon. It is therefore possible to make determination of the thickness of the insulation film at an arbitrary crossing of a first strip conductive layer and a second strip conductive layer by the presence of current flowing between an arbitrary first strip conductive layer and an arbitrary second strip conductive layer when high voltage is applied between the conductive layers.

By making the thickness of the insulation film at the portion correspond to the crossovers of the first strip conductive layer and the second strip conductive layer correspond to a plurality of different data identical in number to the number of film thicknesses, data of a bit number corresponding to the number of the thicknesses can be stored in each crossover of the plurality of first strip conductive layers and the plurality of second strip conductive layers. In other words, each of these crossovers form one memory cell. Because at least two of the film thicknesses of the insulation film at the crossovers are within a range that can generate tunnel phenomenon, tunnel current of a level corresponding to the thickness of the insulation film flows between an arbitrary first strip conductive layer and second strip conductive layer by applying high voltage between the arbitrary first strip conductive layer and second strip conductive layer. The thickness of the insulation film at an crossover of a first strip conductive layer and a second strip conductive layer can be determined by detecting the level of current flowing between the first strip conductive layer and the second strip conductive layer when high voltage is applied therebetween.

Because it is possible to read out data from a memory cell formed by each of the crossings of the first strip conductive layers and the second strip conductive layers, each of these crossings functions sufficiently as a memory cell of a mask ROM. Therefore, integration density of a memory cell in a mask ROM can be improved drastically by providing three or more types of thicknesses of the insulation film at the crossovers of the first strip conductive layers and the second strip conductive layers. The memory capacity of a mask ROM is increased significantly due to increase of information stored in one memory cell by the application of conventional manufacturing technology.

According to the present invention, small-sized memory cells with a simple structure can be obtained to result in a mask ROM significantly advantageous to larger scale integration and storage capacity.

In the case where the above-described manufacturing method according to the present invention is applied to a mask ROM including a memory cell array having predetermined data stored in advance at the time of manufacturing and a peripheral circuit for driving the memory cell array, the plurality of first strip conductive layers are preferably formed as impurity regions at the same time of formation of the source/drain region of the MOS transistor in the peripheral circuit, and the plurality of second strip conductive layers are preferably formed as metal layers at the same time of the formation of the wiring in the peripheral circuit. The plurality of second strip conductive layers may be formed of only polysilicon layer, or a double layer of polysilicon layer and a metal layer at the same time of formation of the gate region of the MOS transistor in the peripheral circuit.

The mask ROM according to the present invention is advantageous to actual manufacturing since the memory cell array and the peripheral circuit can easily be formed at the same time.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 6(a)–6(c) are a sectional view of a mask ROM showing further manufacturing steps of the first manufacturing method.

FIGS. 12(a)–12(c) are a plan view and a sectional view showing a memory array structure of a mask ROM using a PN junction as a memory cell.

FIGS. 18(a)–18(d) are a sectional view and a plan view of a structure of each memory cell in a memory cell array of a mask ROM according to another embodiment of the present invention.

DESCRIPTION OF THE PREFERRED EMBODIMENTS

Figures 1, 1B:
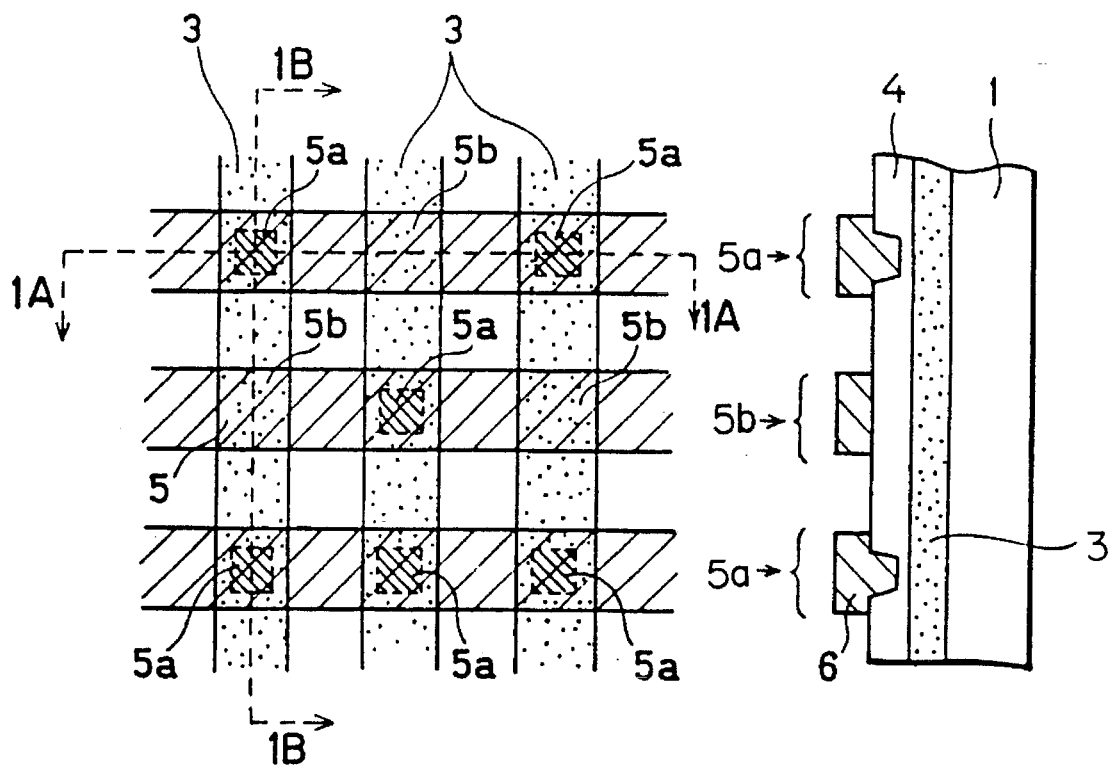
FIG. 1 is a plan view showing a structure of a memory cell array of a mask ROM according to an embodiment of the present invention.
FIGS. 1A and 1B are sectional views showing the structure of the memory cell array shown in FIG. 1.
Figure 1A:
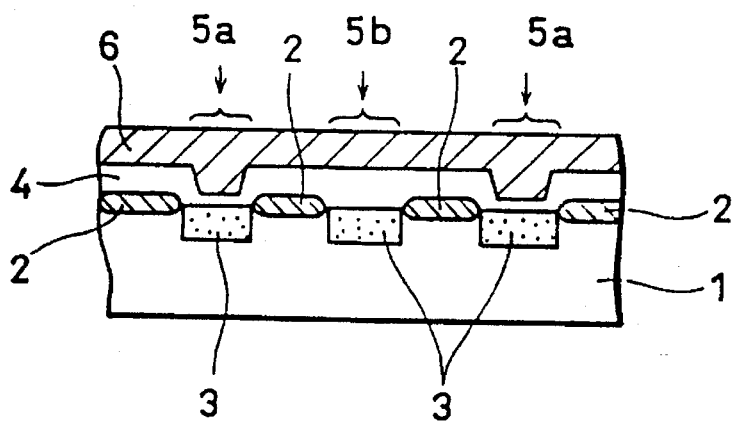

FIGS. 1A and 1B shows a structure of a memory cell array of a mask ROM according to an embodiment of the present invention. FIG. 1 is a plan view of the memory cell array, and FIGS. 1A and 1B are sectional views taken along broken lines A and B in the memory cell array of FIG. 1. The sectional structures of the memory cell array of FIGS. 1A and 1B are slightly simplified in illustration.

Referring to FIGS. 1, 1A and 1B, a memory cell array of a mask ROM comprises a plurality of strip conductive layers 3 formed in parallel to each other on a monocrystal silicon substrate 1, and a plurality of strip conductive layers 6 formed in parallel to each other on semiconductor 3 with an oxide film 4 thereunder, at right angles to the plurality of strip conductive layers 3. Each of the strip conductive layers 3 correspond to one bit line, and each of the strip conductive layers 6 correspond to one word line. Conductive layer 3 is formed by an impurity diffusion layer. Conductive layer 6 is formed of polysilicon or the like. Similar to the mask ROM of FIG. 12, each of the crossings 5 of strip conductive layers 3 forming the bit lines and strip conductive layers 6 forming the word lines corresponds to one memory cell 5. A PN junction is not included in each memory cell 5 in the present embodiment. In the present embodiment, storage data of each memory cell is determined in advance according to the thickness of the oxide film 4 between conductive layers 3 and 6 in the region of the memory cell. More specifically, memory cells 5 in the memory cell array is classified into memory cells 5a having a thin oxide film between conductive layers 3 and 6, and memory cells 5b having a thick oxide film 4 between oxide films 3 and 6. The thickness of oxide film 4 between conductive layers 3 and 6 in memory cell 5a is thin enough for electrons to move from conductive layer 3 to conductive layer 6 via the oxide film 4 in response to the application of high voltage to conductive layer 6, to generate the so-called tunnel phenomenon. The thickness of oxide film 4 between conductive layers 3 and 6 in memory cell 5b is thick enough so that tunnel phenomenon is not generated. The thickness of oxide film 4 in memory cell 5a is 70 Å–100 Å, for example. The thickness of oxide film 4 in memory cell 5b is approximately 400–500 Å, for example. A separation layer 2 is formed beneath oxide film 4 to electrically separate memory cells 5 from each other.

Figure 16:
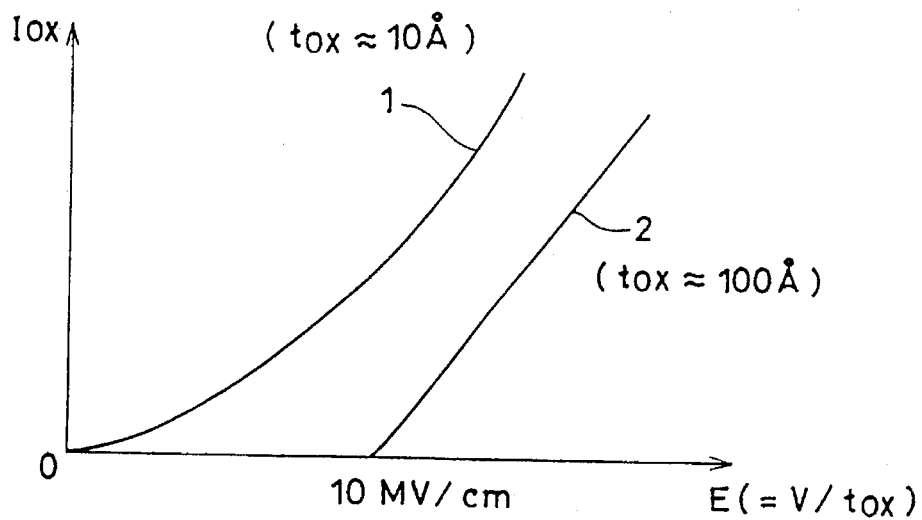
FIG. 16 is a graph showing the relationship between the magnitude of current flowing between two conductive layers via an oxide film sandwiched between the two conductive layers, and the intensity of the electric field induced in the oxide film by application of voltage between the two conductive layers.

FIG. 16 is a graph showing the relationship between the electric field strength E induced in oxide film 4 provided between two conductive layers 3 and 6 and current $I_{ox}$ flowing between these conductive layers 3 and 6. The electric field strength E is calculated by $V/t_{ox}$, where V is the voltage applied between conductive layers 3 and 6 and $t_{ox}$ is the thickness of oxide film 4.

Referring to FIG. 16, it can be appreciated from curve 1 showing the case where thickness $t_{ox}$ of oxide film 4 is approximately 10 Å, current will flow between conductive layers 3 and 6 via oxide film 4 if the voltage applied between conductive layers 3 and 6 is greater than 0 V. This means that oxide film 4 does not serve as an insulation film if the thickness of oxide film 4 between conductive layers 3 and 6 is too thin.

If the thickness $T_{ox}$ of oxide film 4 is, for example, approximately 100 Å, as shown in curve 2, current does not flow between conductive layers 3 and 6 via oxide film 4 if the voltage applied between conductive layers 3 and 6 is not great enough to induce a high electric field of approximately 10 MV/cm in oxide film 4. If a high voltage is applied that induces a high electric field of approximately 10 MV/cm in oxide film 4, current will flow between conductive layers 3 and 6 through oxide film 4 due to the travel of electrons in oxide film 4 to the conductive layer having a potential higher than that of oxide film 4 by tunnel phenomenon.

If oxide film 4 has a very high thickness value $t_{ox}$ of several hundreds Å, the above described tunnel phenomenon will not occur no matter how high the applied voltage between conductive layers 3 and 6 may be. Current will not flow between conductive layers 3 and 6 via oxide film 4.

When one of the plurality of strip conductive layers 6 has high voltage supplied by which an electric field of about 10 MV/cm is induced in oxide film 4 of 70 Å–100 Å thickness and one of the plurality of strip conductive layers 3 is grounded, current due to tunnel phenomenon (tunnel current) flows from the one conductive layer 6 to the one conductive layer 3 if the thickness of oxide film 4 between conductive layers 3 and 6 is thin at the crossing of the one strip conductive layer 3 and the one strip conductive layer 6. However, if oxide film 4 between conductive layers 3 and 6 at this crossing is thick, the aforementioned current will not flow to the one conductive layer 3 since tunnel phenomenon does not occur. The presence of current flowing to strip conductive layer 3 corresponding to a memory cell can be determined according to the presence of a tunnel oxide film in each memory cell. By making the presence or absence of a tunnel oxide film in each memory cell correspond to data 0 or 1, data can be read out from each memory cell 5. By selectively providing a tunnel oxide film in advance at the crossings of strip conductive layer 3 and strip conductive layer 6 according to the data pattern desired to be stored in the memory cell array, the memory cell array can function as a memory cell array exclusively for reading.

Tunnel current is described in document Electronic Material Series "Submicron Device II", pp. 27–34.

Figure 2:
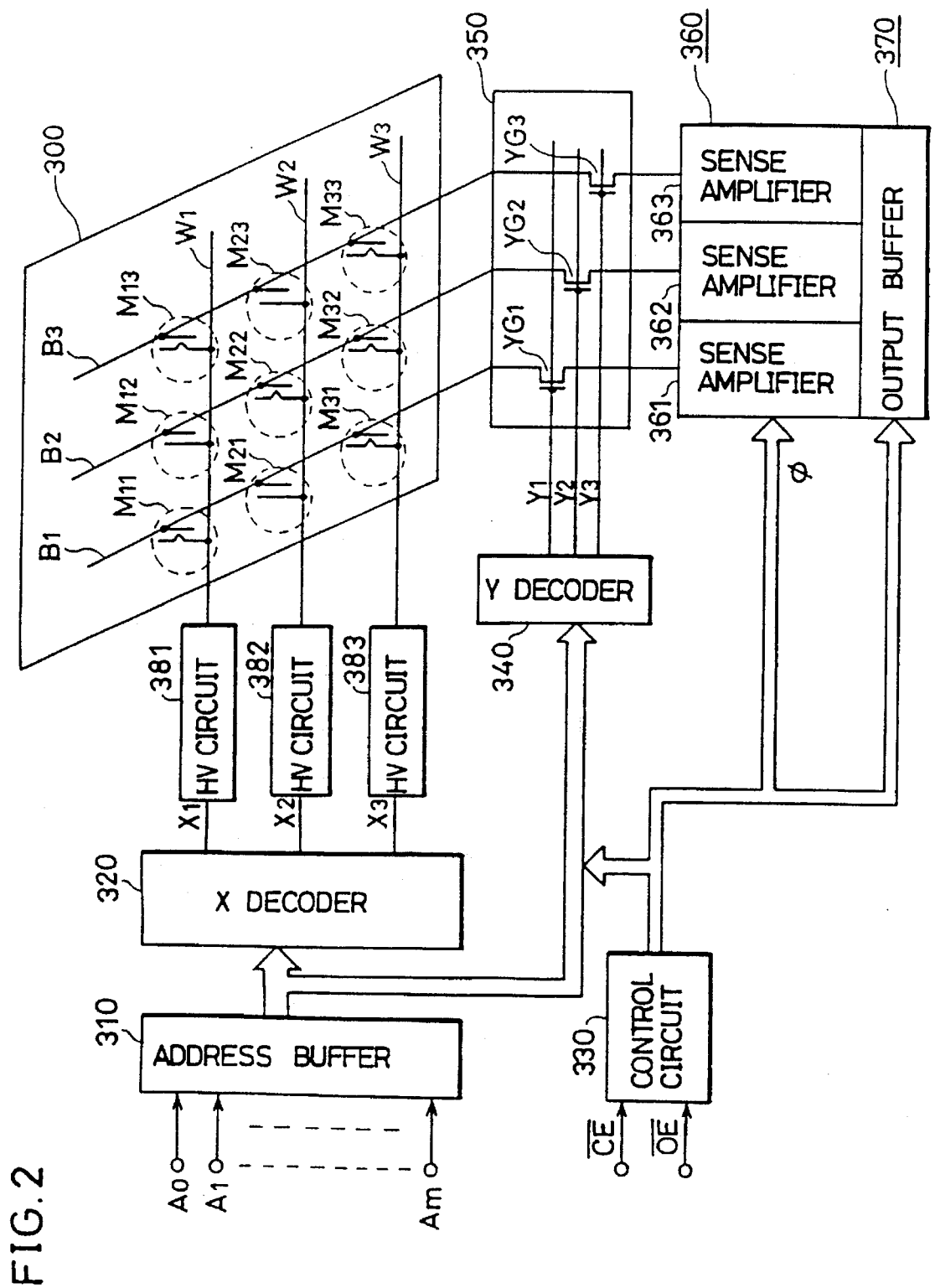
FIG. 2 is a block diagram schematically showing the entire structure of a mask ROM of the present embodiment.

FIG. 2 is a block diagram schematically showing the entire structure of a mask ROM of the present invention. For the sake of simplicity, an example of memory cells arranged in a matrix of 3 rows×3 columns in the memory cell array is shown in FIG. 2. Memory cell 5a having a tunnel oxide film and memory cell 5b not having a tunnel oxide film of FIGS. 1, 1A and 1B are respectively represented in symbols in FIG. 2.

Referring to FIG. 2, memory cell array 300 includes three bit lines B1–B3, three word lines W1–W3, and memory cells Mij (i=1, 2, 3: j=1, 2, 3) provided at each crossings of bit lines B1–B3 and word lines W1–W3. Bit lines B1–B3 and word lines W1–W3 correspond to strip conductive layers 3 and strip conductive layers 6 of FIGS. 1, 1A and 1B, respectively. Memory cells M12, M21 and M23 are memory cells that do not have a tunnel oxide film (memory cell 5b in FIGS. 1, 1A and 1B). The other memory cells M11, M13, M22, M31, M32, and M33 are memory cells having a tunnel oxide film (memory cell 5a in FIGS. 1, 1A and 1B).

For reading out data from memory cell array 300, an address buffer 310, an X decoder 320, a control circuit 330, a Y decoder 340, a Y gate 350, a sense circuit 360, an output buffer 370, and high voltage applying circuits 381–383 are provided. High voltage applying circuits 381, 382 and 383 are provided between X decoder 320 and the respective word lines W1, W2 and W3. Sense circuit 360 comprises three sense amplifiers 361–363. Y gate 350 comprises an N channel MOS transistor YG1 connected between bit line B1 and sense amplifier 361, an N channel MOS transistor YG2 connected between bit line B2 and sense circuit 362, and an N channel MOS transistor YG3 connected between bit line B3 and sense amplifier 363. The ON/OFF of transistors YG1, YG2 and YG3 are controlled by the respective output signals Y1, Y2 and Y3 of Y decoder 340. High voltage applying circuits 381, 382 and 383 are controlled by the respective output signals X1, X2 and X3 of X decoder 320.

Address buffer 310 buffers externally applied address signals via address terminals A0–Am to provide the same to X decoder 320 and Y decoder 340. X decoder 320 decodes the address signal from address buffer 310 to set only the potential of a control signal (one of X1–X3) that should be applied to a high voltage applying circuit (one of 381–383) provided corresponding to one of the three word lines W1–W3 to a level that enables that high voltage applying circuit. The enabled high voltage applying circuit (one of 381–383) applies a high voltage of approximately 10–15 V, for example, to the corresponding word lines W1, W2, or W3. As a result, only one of the word lines W1–W3, corresponding to the address signal has the high voltage applied.

Y decoder 340 decodes the address signal from address buffer 310 to raise the potential of a control signal (one of Y1–Y3) controlling a transistor (one of YG1–YG3) in Y gate 350 which is connected to one of bit lines B1–B3 to a level that can turn on the N channel MOS transistor. Accordingly, only one of transistors YG1–YG3, connected to the bit line corresponding to the address signal is turned on. Therefore, only the one bit line corresponding to the address signal is electrically connected to the corresponding sense amplifier in sense circuit 360. Sense amplifiers 361, 362 and 363 detect the presence of current flowing to transistors YG1, YG2 and YG3, respectively, to provide a data signal according to the sensed result to output buffer 370. Output buffer 370 buffers the data signal output from sense amplifiers 361–363 to provide the same to data output terminals OUT0–OUTn.

Figure 17:
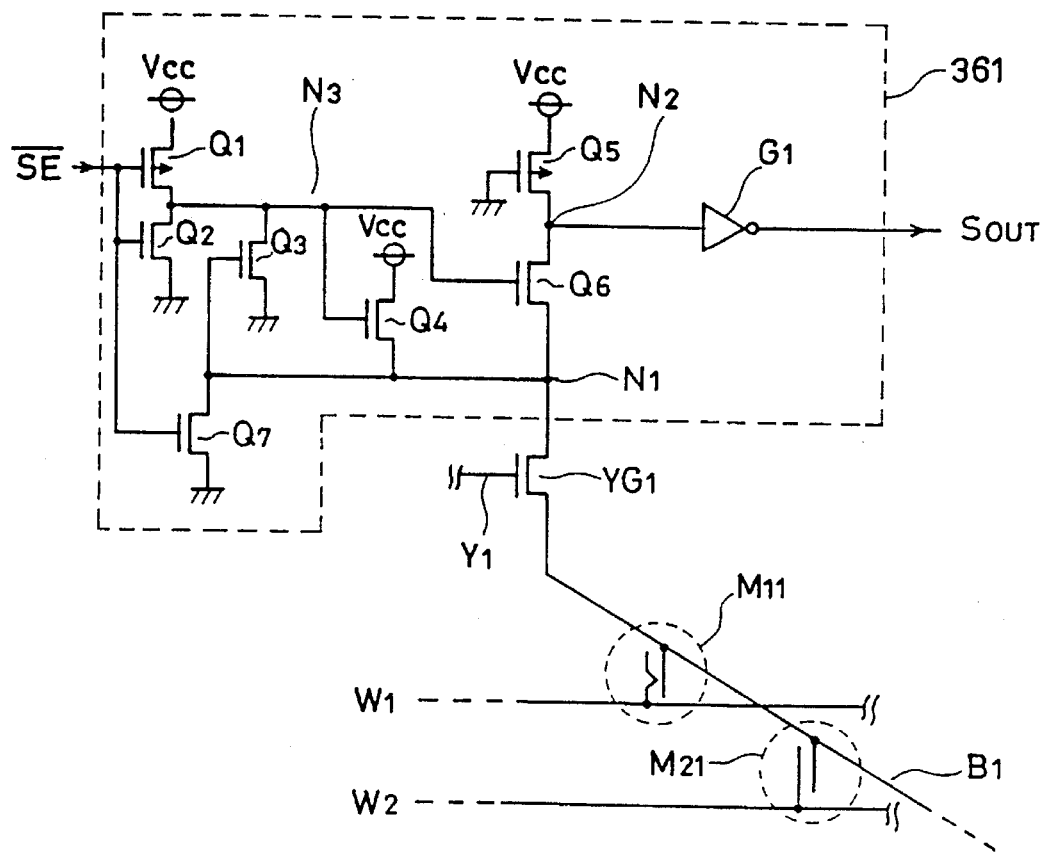
FIG. 17 is a circuit diagram showing a structure of the sense amplifier of FIG. 2.

FIG. 17 is a circuit diagram showing an example of the structure of sense amplifiers 361–363 of FIG. 2. FIG. 17 typically shows the structure of a sense amplifier 361.

When sense amplifier activation signal $\overline{SE}$ is at a low level, sense amplifier 360 operates to read out the data stored in any of the memory cells connected to bit line B1. Activation signal $\overline{SE}$ of a low level will turn ON and OFF P channel MOS transistor Q1 and N channel MOS transistor Q2, respectively, so that potential of a high level is supplied from a normal voltage supply Vcc that supplies a normal driving voltage of 5 V to connection node N3 of transistors Q1 and Q2. This turns on both N channel MOS transistors Q4 and Q6. P channel MOS transistor Q5 is connected between transistor Q6 and normal voltage supply vcc which is always ON by receiving ground potential.

The ON state of transistors Q4 and Q6 will cause the gate potential of N channel MOS transistor Q3 to be raised by normal voltage supply Vcc. N channel MOS transistor Q7 is at the OFF state in response to activation signal $\overline{SE}$ of a low level. Therefore, the gate potential of transistor Q3 exceeds the threshold voltage of transistor Q3 to turn on transistor Q3.

Thus, the potential of node N3 will begin to fall so that current flowing to transistors Q4 and Q6 are reduced. Accordingly, the potentials of nodes N1 and N2 begin to fall. However, when the potential of node N1 becomes lower than the threshold voltage of transistor Q3, transistor Q3 is turned off, so that the potential of node N3 will again begin to rise due to the current supplied from transistor Q1. The current flowing to transistors Q4 and Q6 again increase to raise the potentials of nodes N1 and N2 again. When the potential of node N1 exceeds the threshold voltage of transistor Q3, transistor Q3 is turned on again to decrease the potential of node N3.

Such a circuit operation is repeated so that the potentials of nodes N1 and N2 stabilize at constant values. For example, the potential of node N1 is stabilized at approximately 1 V. Therefore, when transfer gate YG1 is turned on, approximately 1 V is applied to bit line B1.

At the time of data read out from memory cell M21, for example, a high voltage of approximately 10 V is applied to word line W2. Memory cell M21 does not have a tunnel oxide film, so current does not flow to bit line B1. Therefore, the potentials of nodes N1 and N2 are held at the above-described constant values.

At the time of data read out from memory cell M11, for example, the above-described high voltage is applied to word line W1. In response to the application of such a high voltage, current flows to bit line B1 because memory cell M11 has a tunnel oxide film. When transfer gate Y1 is turned on, the potential of node N1 begins to decrease from the above-described constant value. Then, the circuit operations begins to be repeated of: decrease of the potential of node N1 below the threshold voltage of transistor Q3, the rise in potential of node N3 due to transistor Q3 attaining an OFF state, increase of current flowing to transistors Q4 and Q6 due to potential rise of node N3, potential rise in nodes N1 and N2 due to increase in current flowing to transistors Q4 and Q6, conduction of transistor Q3 due to potential rise of node N1, potential decrease of node N3 due to transistor Q3 attaining an ON state, decrease of current flowing to transistors Q4 and Q6 due to potential drop of node N3, and potential decrease of nodes N1 and N2 due to decrease of current flowing to transistors Q4 and Q6. As a result, the potential of node N1, i.e. the potential of bit line B1, and the potential of node N2 are stabilized to values that are lower than the above-described constant values.

According to the cases where current flows or not flows to bit line B1, the potential of node N2 is stabilized to a different value after transfer gate YG1 attains an ON state.

The threshold voltage of inverter G1 is set to a value between the potential of node N2 when current does not flow to bit line B1, and the potential of node N2 when current flows to bit line B1. Therefore, output voltage Sow of inverter G1 becomes a low level in response to the conduction of transfer gate YG1 when reading out data from a memory cell M21 that does not have a tunnel oxide film, and becomes a high level in response to the conduction of transfer gate YG1 when reading out data from a memory cell M11 that has a tunnel oxide film.

Control circuit 330 buffers a low activation chip enable signal $\overline{CE}$ instructing whether the mask ROM chip should operate or not, and a low activation output enable signal $\overline{OE}$ instructing whether to inhibit or permit output of a data signal from output buffer 370 to data output terminals OUT0–OUTn. In response to these buffered signals, control circuit 330 provides a control signal for enabling or disabling the operations of Y decoder 340 and output buffer 370.

Each of bit lines B1–B3 is grounded in the corresponding sense amplifier 361–363 during the time period when the corresponding transistor YG1–YG3 in Y gate 350 is ON.

Figures 3, 4:
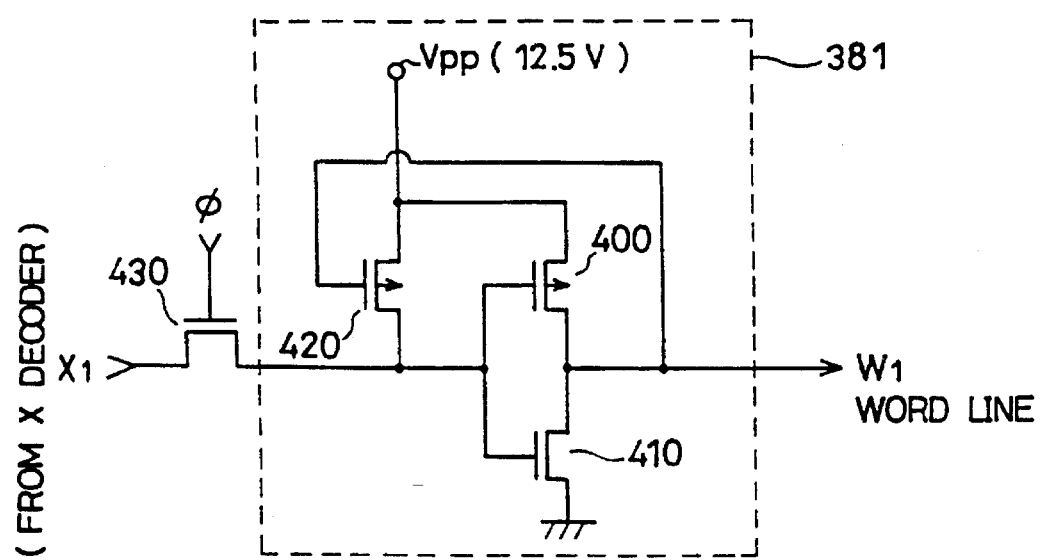
FIG. 3 is a diagram for showing the difference in electrical characteristic between a memory cell having a tunnel oxide film and a memory cell not having a tunnel oxide film in a mask ROM of the present embodiment.
FIG. 4 is a circuit diagram showing an example of a specific structure of a high voltage applying circuit of FIG. 2.

For reading out data in this mask ROM, high voltage and ground potential are applied to the word line and the bit line, respectively, connected to the memory cell desired to have data read out. The function of data reading in this mask ROM will be explained hereinafter with reference to FIG. 3. FIG. 3 is a diagram showing the difference in electrical characteristics of a memory cell having a tunnel oxide film and a memory cell not having a tunnel oxide film.

The magnitude of current across the bit line connected to memory cell 5a having a tunnel oxide film and across the bit line connected to memory cell 5b not having a tunnel oxide film are shown in the table in FIG. 3. In this table, $V_L$ indicates a potential that is within a range that does not allow generation of tunnel phenomenon in a memory cell having a tunnel oxide film, and $V_H$ indicates a potential that is within a range that allows the generation of tunnel phenomenon in a memory cell having a tunnel oxide film, for example 10 V–15 V.

Referring to FIGS. 1, 1A, 1B and 3, the application of ground potential and high voltage to a bit line (conductive layer 3) and a word line (conductive layer 6), respectively, corresponding to memory cell 5a having a tunnel oxide film, causes current to flow towards ground via tunnel oxide film 4 and the corresponding bit line from the corresponding word line. The magnitude of this current is approximately several ten μA. If the potential of the word line connected to memory cell 5a having a tunnel oxide film is not such a high voltage and is within the range $V_L$, tunnel current does not flow since a voltage high enough to generate tunnel phenomenon in oxide film 4 is not applied. Accordingly, current does not flow across the aforementioned corresponding bit line. Consider the case where the aforementioned corresponding bit line is at a floating state. In this case, current does not flow across the corresponding bit line regardless of the potential of the corresponding word line since the corresponding bit line is not electrically connected to any potential source.

When ground potential and high potential are applied to the bit line and the word line, respectively, corresponding to memory cell 5b not having a tunnel oxide film, tunnel current does not flow between conductive layers 3 and 6 since there is a thick oxide film 4 therebetween. This means that no current crosses the bit line corresponding to memory cell 5b not having a tunnel oxide film, regardless of the magnitude of potential of the word line corresponding to the memory cell 5b. Also, if the corresponding bit line is at a floating state in memory cell 5b not having a tunnel oxide film, no current flows across the bit line regardless of the potential of the corresponding word line.

Thus, data can be read out from a desired memory cell in a memory cell array by implementing the peripheral circuit for reading out data from the memory cell array as shown in FIG. 2.

Consider a case where an external address signal indicating the address of memory cell M22 is applied to address terminals A0–Am in FIG. 2. In this case, high voltage applying circuit 382 is enabled by X decoder 320, whereas transistor YG2 is turned on by Y decoder 340. Only the potential of word line W2 attains a high potential of approximately 10–15 V, and the potentials of the other word lines W1 and W3 attain a low potential within the range $V_L$. Also, ground potential is applied only to bit line B2, and the other bit lines B1 and B3 attain a floating state. Therefore, none of the six memory cells M11–M13 and M31–M33 connected to word lines W1 and W3 not having high voltage applied (referred to as a word line of non-selected state hereinafter) can not have current flow to the corresponding bit lines B1–B3, regardless of whether having a tunnel oxide film or not. Current does not flow across bit lines B1 and B3 (referred to as a bit line of non-selected state hereinafter) connected to transistors YG1–YG3 in Y gate 350 turned off, i.e. connected to transistors YG1 and YG3, regardless of whether the respective connected memory cells M11, M21, M31 and M13, M23, and M33 have a tunnel oxide film or not. Only the structure (whether having a tunnel oxide film or not) of memory cell M22 provided corresponding to the crossing (referred to as the selected memory cell hereinafter) of the word line W2 attaining high potential (referred to as a word line of a selected state hereinafter) and bit line B2 (referred to as a bit line of a selected state hereinafter) connected to transistor YG2 turned on in Y gate 350 determines the presence of current flowing across bit line B2 of a selected state. Current flows across bit line B2 since memory cell M22 has a tunnel oxide film. Sense circuit 362 senses this current to provide a data signal corresponding to logic value 0 or 1. Conversely, if the selected memory cell does not have a tunnel oxide film, current does not flow across the bit line of a selected state so none of sense amplifiers 361–363 senses current. In this case, sense amplifiers 361–363 provide a data signal corresponding to a logic value opposite of that of the output data signal when current is sensed. Thus, the stored data of the memory cell located at the address indicated by the address signal is provided from output buffer 370.

FIG. 4 is a circuit diagram showing an example of a structure of high voltage applying circuits 381–383. High voltage applying circuit 381 is typically shown in FIG. 4.

Referring to FIG. 4, high voltage applying circuit 381 comprises a P channel MOS transistor 400 and an N channel MOS transistor 410 receiving through an N channel MOS transistor 430 at its gates a corresponding output signal X1 from X decoder 320, and a P channel MOS transistor 420 provided between high voltage supply Vpp and the gates of transistors 400 and 410. Transistors 400 and 410 are connected in series between high voltage supply Vpp which supplies high voltage of approximately 10 V–15 V and ground to implement an inverter. The node of transistors 400 and 410 is connected to the corresponding word line W1 and the gate of transistor 420. High voltage supply Vpp constantly provides high voltage of approximately 10–15 V, for example, 12.5 V.

Transistor 430 attains an ON state for a constant time period at the time of data reading in response to the gate receiving a predetermined control signal φ. If the logic level of the signal X1 is at a high level, transistor 410 conducts to have ground potential provided to word line W1. At the same time, transistor 420 also conducts, whereby high potential applied to the gate of transistor 410 via transistor 420 from high voltage supply vpp fixes transistor 410 to an ON state. When the logic level of signal X1 attains a low level, transistor 400 conducts so that high potential of 10–15 V is provided to word line W1 from high voltage supply Vpp. At the same time, transistor 420 is turned off, whereby high potential from high voltage supply vpp will not be supplied to the gate of transistor 400. Therefore, transistor 400 is fixed to an ON state.

When the logic levels of the gate potentials of transistors 400 and 410 are determined by output signal X1 of X decoder 320, control signal φ becomes a low level to turn off transistor 430. Therefore, the output potential of X decoder 320 will not influence the potential of the input terminal of high voltage applying circuit 381.

The output potential of X decoder 320 is generally within the range of 0 V–5 V. In other words, X decoder 320 is implemented to output 5 V as potential of high level, and 0 V as potential of low level. When transistor 430 is always at the ON state, the gates of transistors 400 and 410 are electrically connected to high voltage supply vpp by transistor 420, and supplied with a potential that is lower than the output potential of high voltage supply Vpp from X decoder 320, when signal X1 is at a high level. As a result, the gate potentials of transistors 400 and 410 decrease. In order to avoid such a phenomenon, transistor 430 is turned on only during the period that is required for high voltage applying circuit 381 to fetch output signal X1 of X decoder 320.

When word line W1 should be the low potential within range $V_L$, i.e. when a high level potential of signal X1 is applied to high voltage applying circuit 381 via transistor 430, the gate potential of transistor 400 becomes a potential (5 V) that is lower than the source potential (output potential 10 V–15 V of high voltage supply Vpp) if transistor 420 does not exist. Not only transistor 410, but also transistor 400 is turned on, so that the potential of word line W1 will not decrease to the former potential corresponding to the low level. However, if transistor 420 exists, the output potential of high voltage supply Vpp is supplied to the gate of transistor 400 by means of transistor 420 attaining an ON state. Because transistor 400 is controlled to an OFF state, such a problem does not occur.

High voltage applying circuits 382 and 383 also comprise the circuit structure of FIG. 4. When the circuit structure of FIG. 4 is employed in each of high voltage applying circuits 381–383, X decoder 320 provides a signal of a low level to only the high voltage applying circuit provided corresponding to the word line connected to the memory cell specified by the address signal from address buffer 310, and a signal of a high level to the other high voltage applying circuits. Hence, high voltage is applied only to the word line corresponding to the memory cell specified by the address signal.

In the memory cell array of the mask ROM of the present embodiment, each location forms one memory cell where the first strip conductive layers forming bit lines and the second strip conductive layers forming word lines overlap each other. The stored data of each memory cell is determined by the thickness of the oxide film existing between the first strip conductive layer and the second strip conductive layer in that location. Therefore, the area required for one memory cell depends on the widths of the first strip conductive layer and the second strip conductive layer. The minimum values of these widths are determined by the limit value of the line-and-space in the current manufacturing techniques. As in the case of a conventional mask ROM in which one memory cell is formed by one PN junction, the area of one memory cell occupying the face of the semiconductor substrate can be drastically reduced by minimizing the width of the conduction layers. According to a mask ROM of the present embodiment, a small-sized mask ROM more advantageous to larger scale integration can be obtained in comparison with a mask ROM in which a MOS transistor is used as a memory cell.

Figure 7:
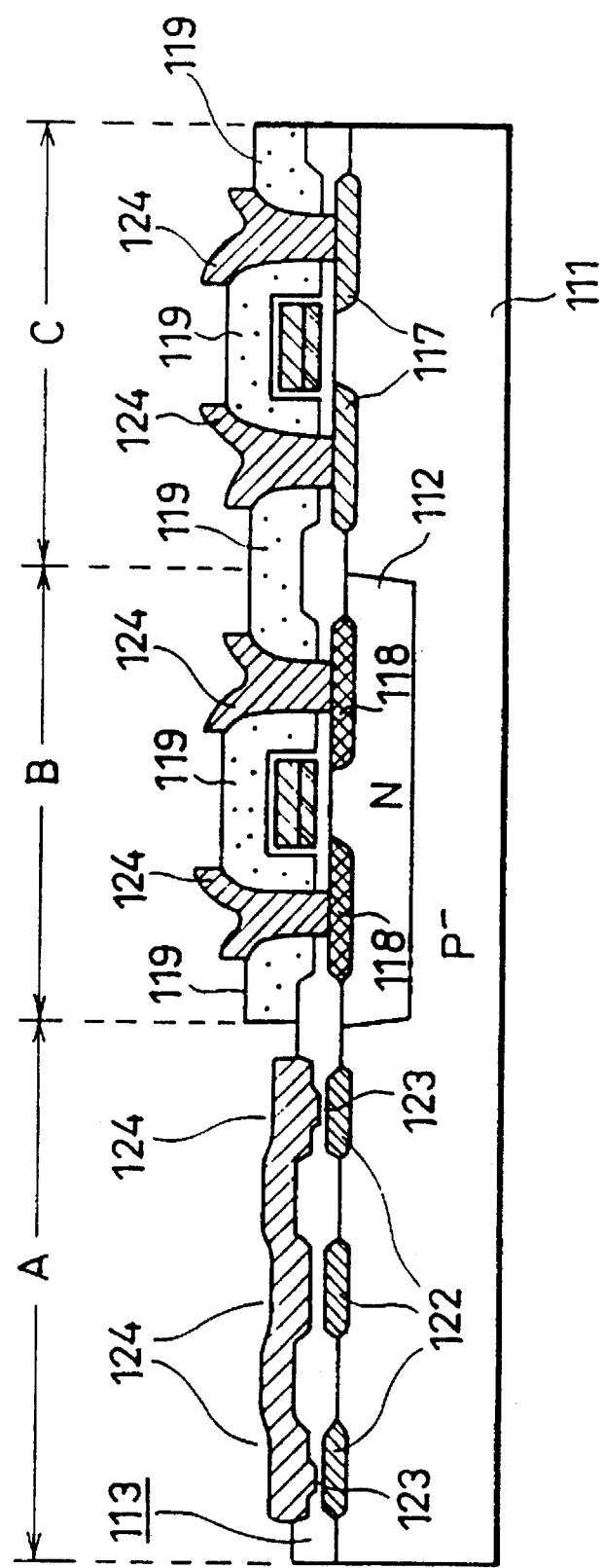
FIG. 7 is a sectional view of a mask ROM showing still further manufacturing steps in the first manufacturing method.
Figure 8A:
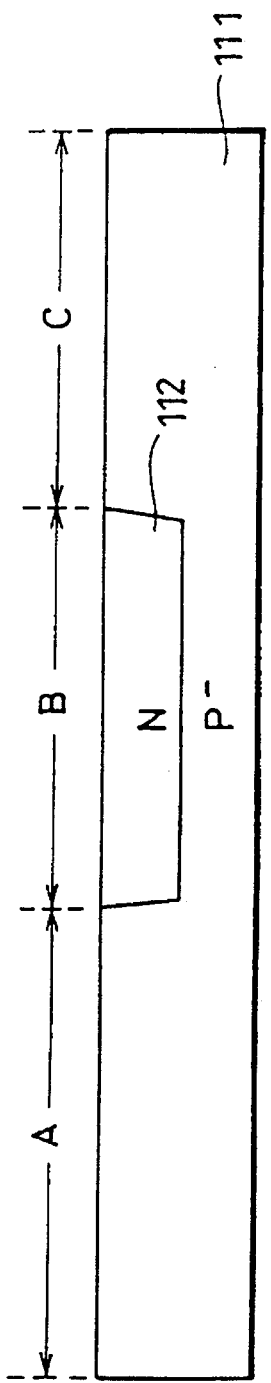
FIGS. 8(a)–8(c) are a sectional view of a mask ROM according to the present invention showing a portion of the manufacturing steps included in the second manufacturing method.
Figure 8B:
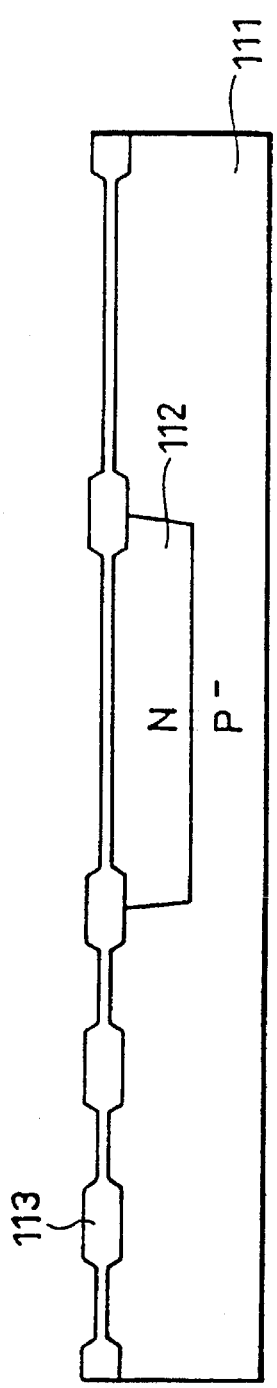

An example of the manufacturing method of a mask ROM of the present embodiment will be explained with reference to FIGS. 5–10. FIGS. 5–7 are sectional views of a mask ROM of the present embodiment showing an example of the manufacturing method. FIGS. 8–10 are sectional views of a mask ROM of the present embodiment showing a second example of the manufacturing method. FIGS. 5–10 show a sectional view of a mask ROM of the present embodiment taken along broken line A of FIGS. 1, 1A and 1B.

Figure 5A:
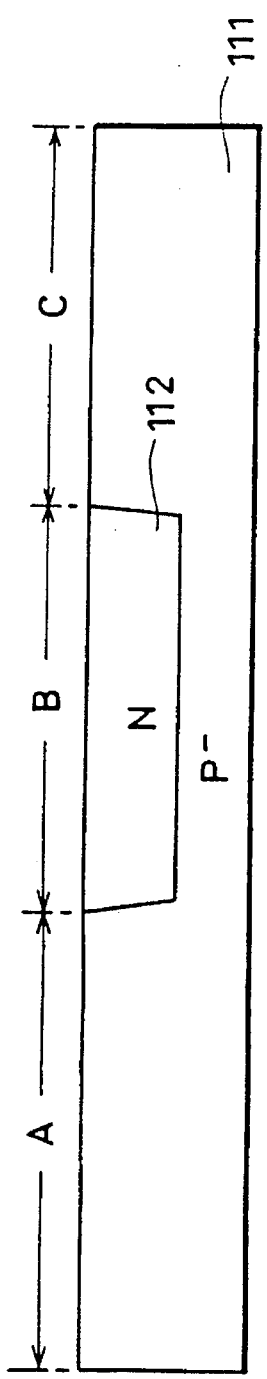
FIGS. 5(a)–5(c) are a sectional view of a mask ROM of the present embodiment showing a portion of the manufacturing steps included in the first method of manufacturing.
Figure 5B:
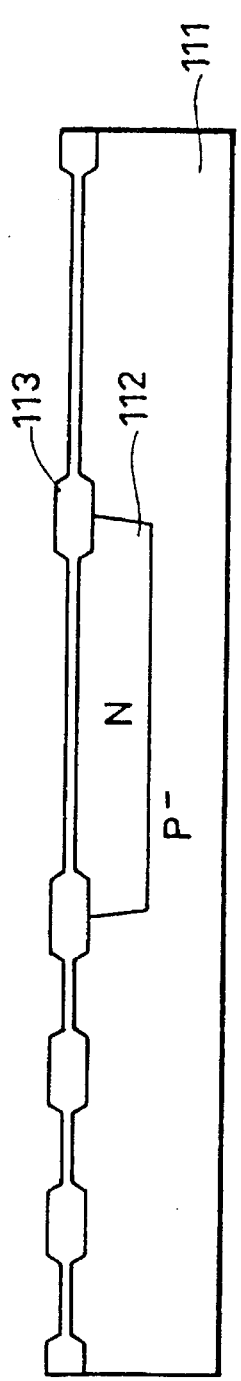
Figure 5C:
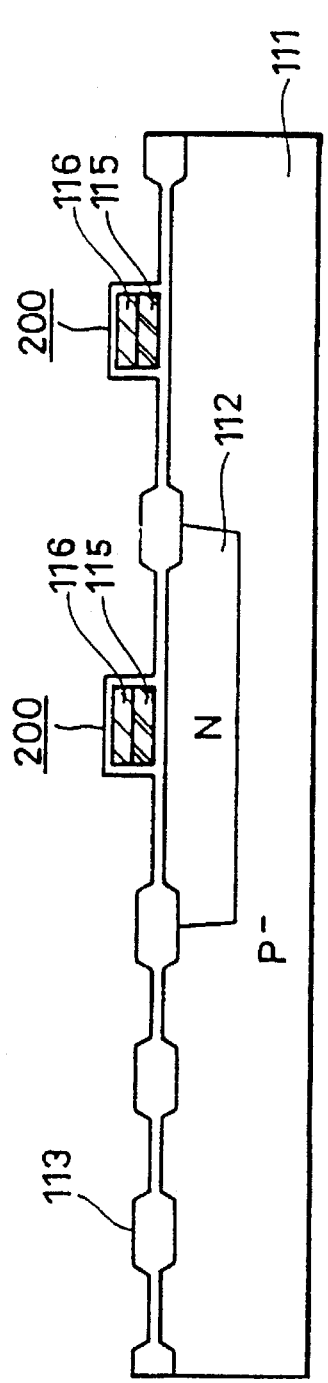

Referring to FIG. 5(a), N type impurities are selectively introduced onto the main surface of P type substrate 111 of low impurity concentration corresponding to regions B and C at the peripheral of memory cell array region A where a memory cell array is to be formed to form an island-like N well 112. N well 112 is formed in P channel MOS transistor region B where a P channel MOS transistor is to be formed. An oxide film 113 is then formed on the main surface of substrate 111 including N well 112 by selective local oxidation. As shown in FIG. 5(b), oxide film 113 is thickly formed for element isolation between the respective boundaries of memory cell array region A, P channel MOS transistor region B, and N channel MOS transistor region C where an N channel MOS transistor is to be formed, and also between regions MC where each memory cell is to be formed in memory cell array region A, and thinly formed in the remaining regions so as not to decrease the transmittance of the impurities. Next, conductive layer 200 of polysilicon layer 115 and metal layer 116 are selectively formed on the main surface of substrate 111 corresponding to peripheral regions B and C (refer to FIG. 5(c)). Conductive layer 200 is used as a gate in each of P channel MOS transistor region B and N channel MOS transistor region C.

N type impurities are selectively implanted onto the main surface of substrate 111 corresponding to memory cell array region A and N channel MOS transistor region C, and P type impurities are selectively implanted onto the main surface of substrate 111 corresponding to P channel MOS transistor region B. Thus, a plurality of strips of N type impurity diffusion layers 122 extending at right angles to the paper plane, P type impurity diffusion layers 118 serving as the source and drain of P channel MOS transistors, and N type impurity diffusion layers 117 serving as the source and drain of a N channel MOS transistor are formed in the memory cell array region A, P channel MOS transistor region B, and N channel MOS transistor region C, respectively. Each of N type diffusion layers 122 serves as one bit line. In order to eliminate steps in the surface of peripheral regions B and C to make planar the surface thereof, insulation film 119 is formed only at the regions corresponding to peripheral regions B and C of the main surface of substrate 111 including oxide film 113 and conductive layers 200 (refer to FIG. 6(a)). As shown in FIG. 6(b), contact hole 120 is selectively provided in insulation film 119. In P channel MOS transistor region B, contact hole 120 is provided so that P type impurity diffusion layer 118 is exposed. In N channel MOS transistor region C, contact hole 120 is provided so that N type impurity diffusion layer 117 is exposed. Referring to FIG. 6(c), the areas of oxide film 113 corresponding to each of regions MC where a memory cell is to be formed is processed selectively corresponding to the stored data to have a thickness that can generate tunnel phenomenon. Thus, tunnel oxide film 123 is formed at a predetermined location corresponding to the data to be stored in the memory cell array.

Finally, conductive layer 124 of metal such as aluminum is selectively formed on oxide film 113 and tunnel oxide film 123, and on insulation film 119. Referring to FIG. 7, a plurality of strips of conductive layer 124 are provided in memory cell array region A at right angles to N type impurity diffusion layers 122. In memory cell array region A, one conductive layer 124 is used as one bit line. In peripheral regions B and C, conductive layer 124 is used as an interconnection layer connected to the source/drain of a MOS transistor.

According to the above method of manufacturing, the step of storing data in a memory cell array, i.e. the step of selectively forming a tunnel oxide film in the regions where a memory cell is to be formed is implemented in the latter half of the entire manufacturing steps of a mask ROM. Providing or not providing a tunnel oxide film in a memory cell in the memory cell array depends upon the data to be stored in the mask ROM. Considering reduction in the period of time from receiving a user's specification of a predetermined data (receiving an order of manufacturing a mask ROM) to delivering the ordered product to a user (the turn around time), it is advantageous to implement the tunnel oxide film formation step into the latter half of the manufacturing steps of a mask ROM chip.

Figure 8C:
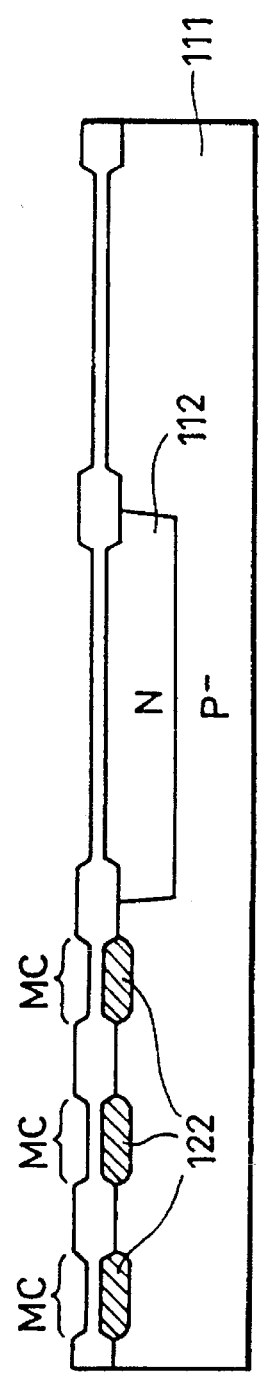

Another method of manufacturing will be described hereinafter. Similar to the above-described method of manufacturing, N well 112 and oxide film 113 are formed on the main surface of P type substrate 111 of low impurity concentration (refer to FIGS. 8(a) and (b)). Then, N type impurities are selectively implanted only into the portion corresponding to memory cell array region A on the main surface of substrate 111. Referring to FIG. 8(c), a plurality of strips of N type impurity diffusion layers 122 (each used as one word line) are formed extending in a direction at right angles to the paper plane.

Figure 9A:
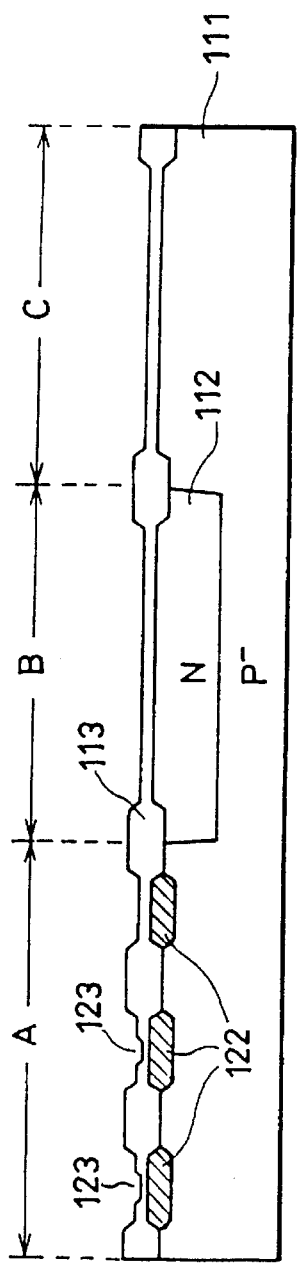
FIGS. 9(a)–9(c) are a sectional view of a mask ROM showing further manufacturing steps in the second manufacturing method.
Figure 9B:
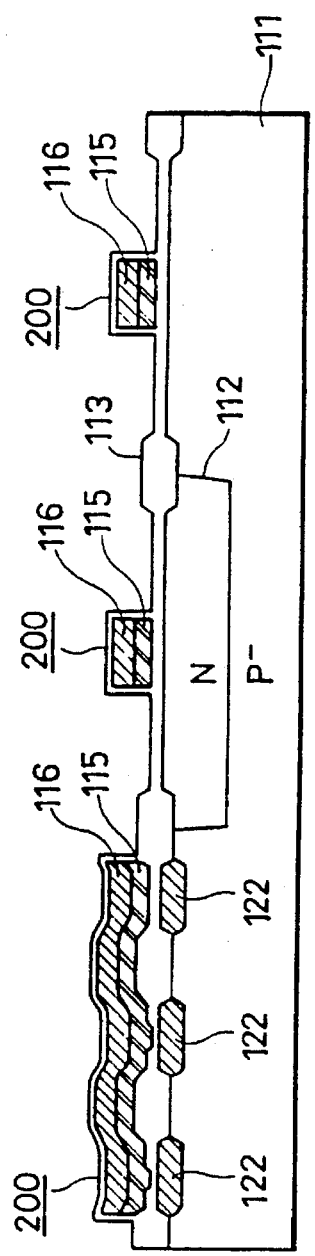
Figure 9C:
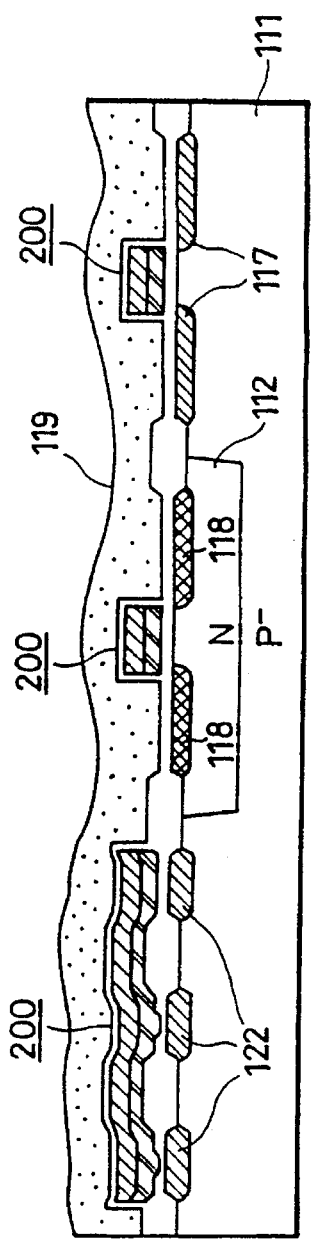

Next, only the portions of oxide film 113 corresponding to each regions MC where a memory cell is to be formed is processed selectively according to the data to be stored in memory cell array region A to have a thickness that can generate tunnel phenomenon. Referring to FIG. 9(a), tunnel oxide films 123 are formed in some of regions MC where a memory cell is to be formed. Next, a double layered conductive layer 200 of polysilicon layer 115 and metal layer 116 is selectively formed on oxide film 113 and on tunnel oxide film 123 (refer to FIG. 9(b)). In memory cell array region A, a plurality of strips of conductive layers 200 are formed at right angles to each of N type impurity diffusion layers 122. Each of strip conductive layers 200 is used as one word line. In peripheral regions B and C, conductive layer 200 is used as a gate electrode. P type impurities are then selectively implanted into the region corresponding to P channel MOS transistor region B, and N type impurities are selectively implanted into the regions corresponding to N channel MOS transistor region C onto the main surface of substrate 111. Referring to FIG. 9(c), therefore, P type impurity diffusion layer 118 to be used as the source/drain is formed in P channel MOS transistor region B, and N type impurity diffusion layer 117 to be used as the source/drain is formed in N channel MOS transistor C. Insulation film 119 is formed all over the main surface of substrate 111 to minimize the steps in the surface of memory cell array region A and peripheral regions B, C.

Figure 10A:
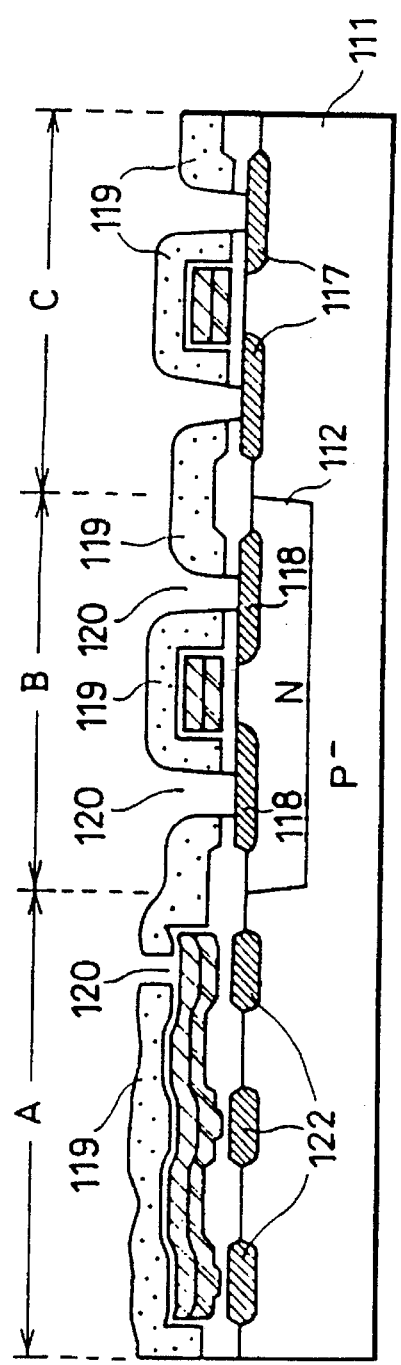
FIGS. 10(a)–10(b) are a sectional view of a mask ROM showing still further manufacturing steps in the second manufacturing method.
Figure 10B:
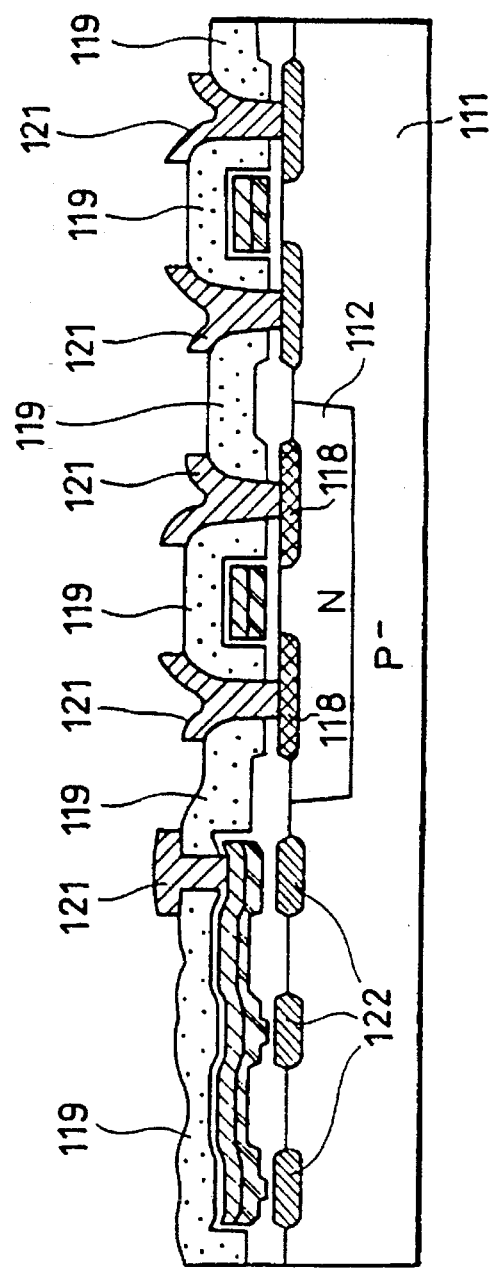

Referring to FIG. 10(a), contact hole 120 is selectively generated in insulation film 119. In memory cell array region A, contact hole 120 is provided so that conductive layer 200 is exposed. In P channel MOS transistor region B, contact hole 120 is provided so that P type impurity diffusion layer 118 is exposed. In N channel MOS transistor region C, contact hole 120 is provided so that N type impurity diffusion layer 117 is exposed. Finally, referring to FIG. 10(b), conductive layer 121 of metal such as aluminum or the like is selectively formed on insulation film 119 to fill contact hole 120. In memory cell array region A, conductive layer 121 is provided as an interconnection layer connected to a double layered conductive layer 200 functioning as a word line. In peripheral regions B and C, conductive layer 121 is used as an interconnection layer connected to the source/drain of the MOS transistor.

According to the above-described method of manufacturing, the tunnel oxide film formation step for storing data in a memory cell array is implemented into the former half of the manufacturing steps of a mask ROM. This manufacturing method has an advantage that formation of an insulation film only at particular regions for making planar the surface of the substrate is not required. There is also another advantage that the word line and the gate electrode of a MOS transistor can be formed simultaneously.

Since the manufacturing method of a mask ROM of the present invention is not limited to the above-mentioned one methods, an appropriate manufacturing method can be selected according to the conditions and objects of the structure of the desired product.

Two specific methods of forming a tunnel oxide film in the steps shown in FIGS. 7 and 9(a) will be described hereinafter. One method is to etch only the locations in oxide film 113 corresponding to the regions where a memory cell having a tunnel oxide film is to be formed to a thickness that can generate tunnel phenomenon. FIG. 11 is a sectional view for describing the second method.

Figure 11A:
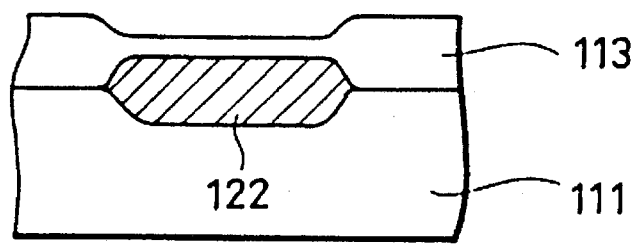
FIGS. 11(a)–11(c) are a sectional view of a tunnel oxide film showing an example of formation thereof.
Figure 11B:
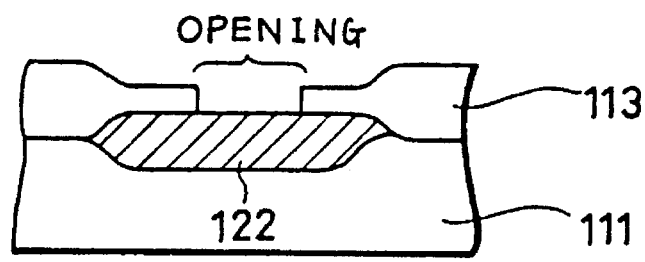
Figure 11C:
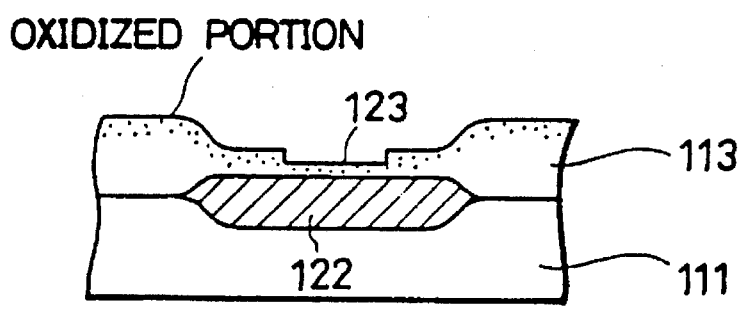
Figure 13A:
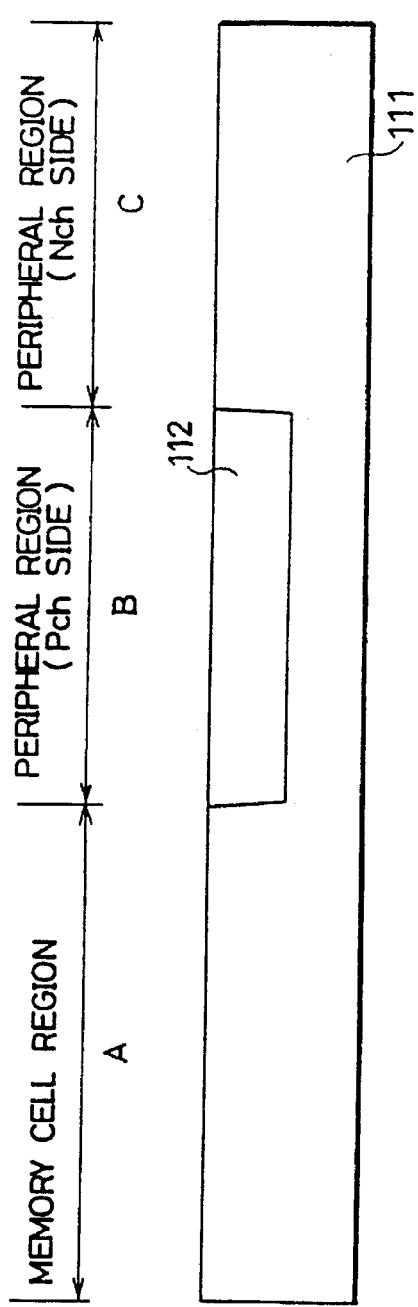
FIGS. 13(a)–13(c) are a sectional view of a mask ROM using a PN junction as a memory cell showing an example of the manufacturing method.
Figure 13B:
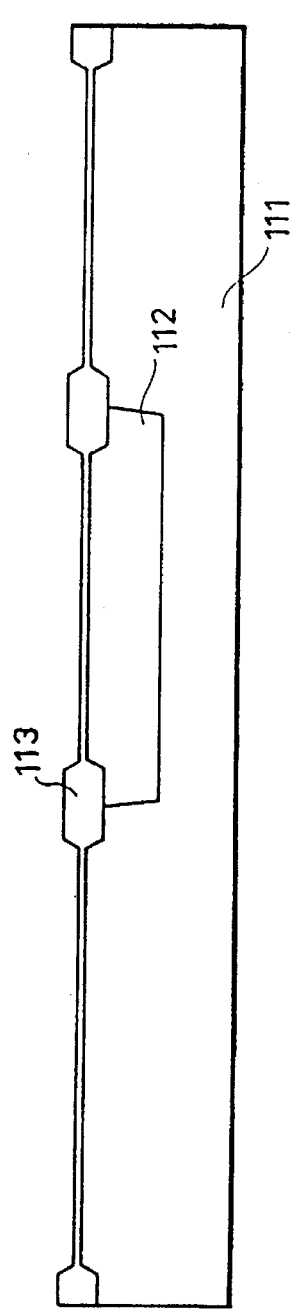
Figure 13C:
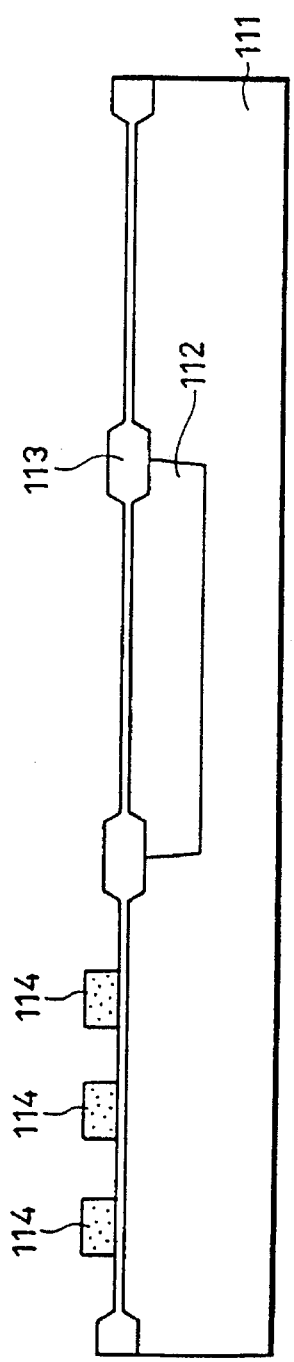
Figure 14A:
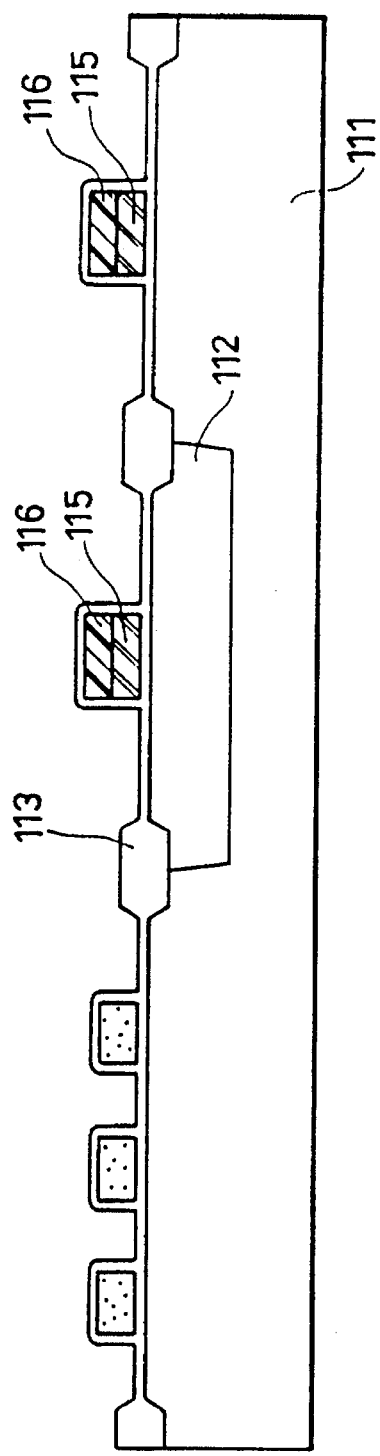
FIG. 14(a)–14(d) are a sectional view of a mask ROM using a PN junction as a memory cell showing further manufacturing steps of the manufacturing method.
Figure 14B:
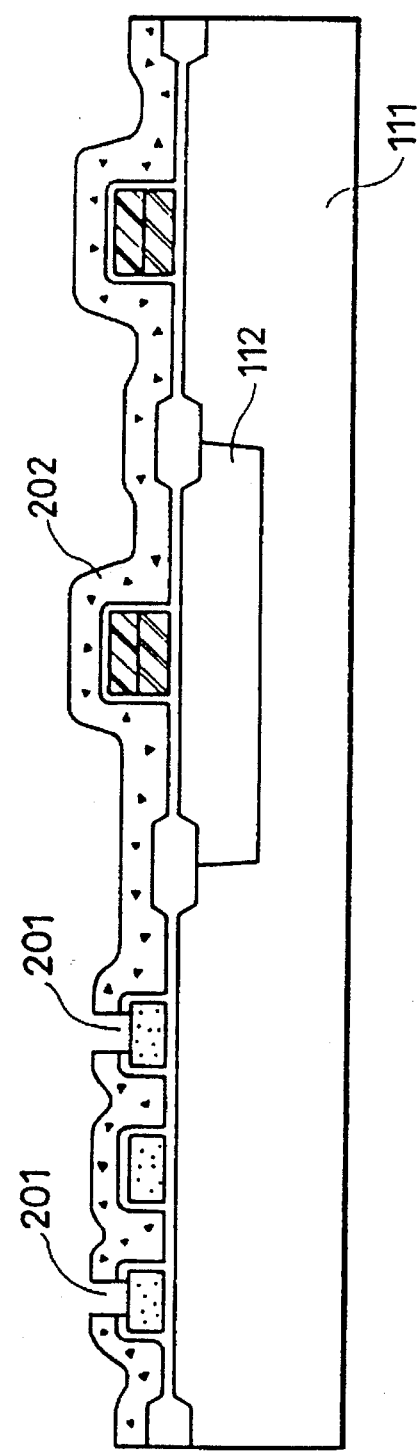
Figures 14C, 14D:
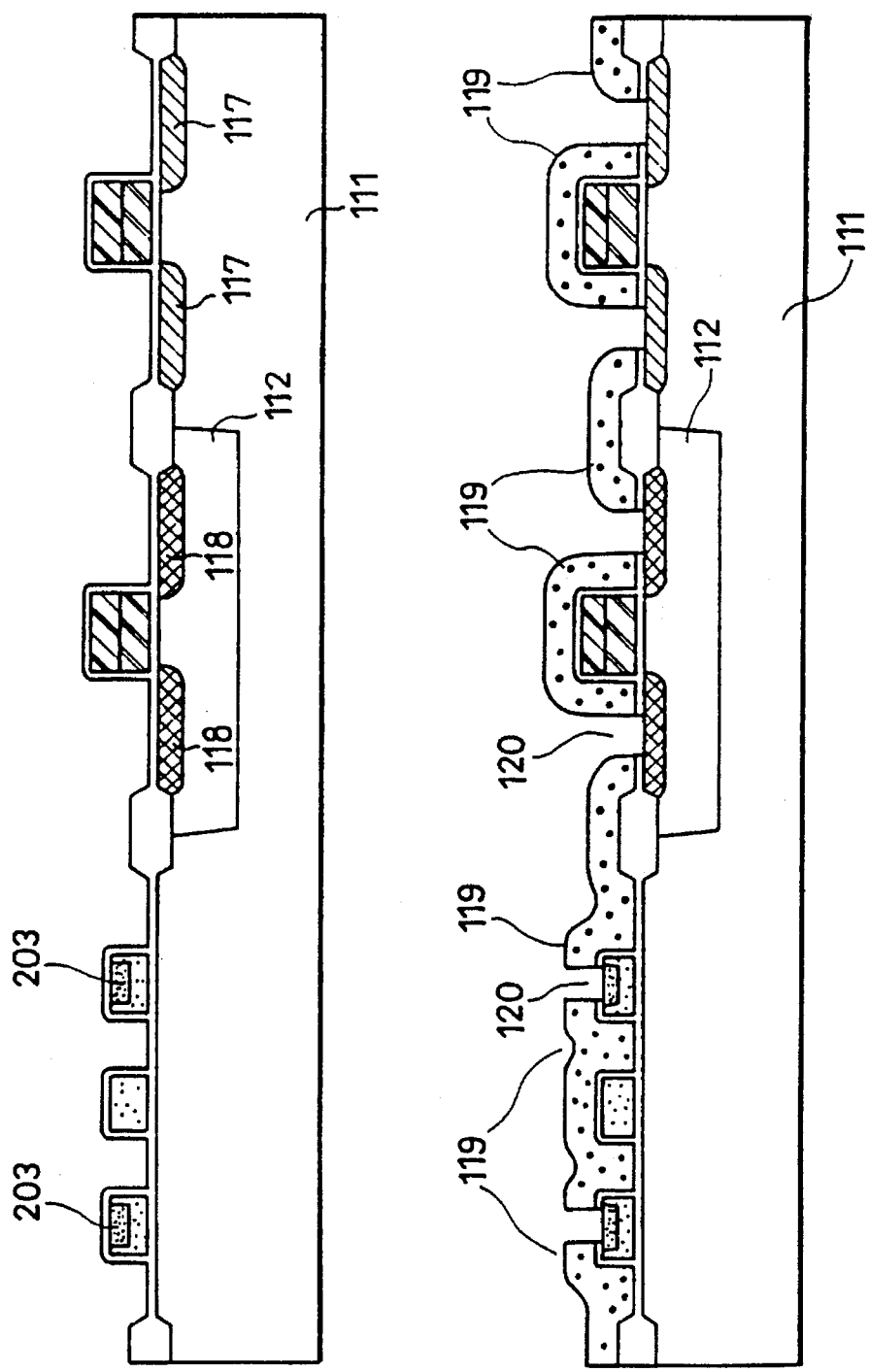
Figure 15:
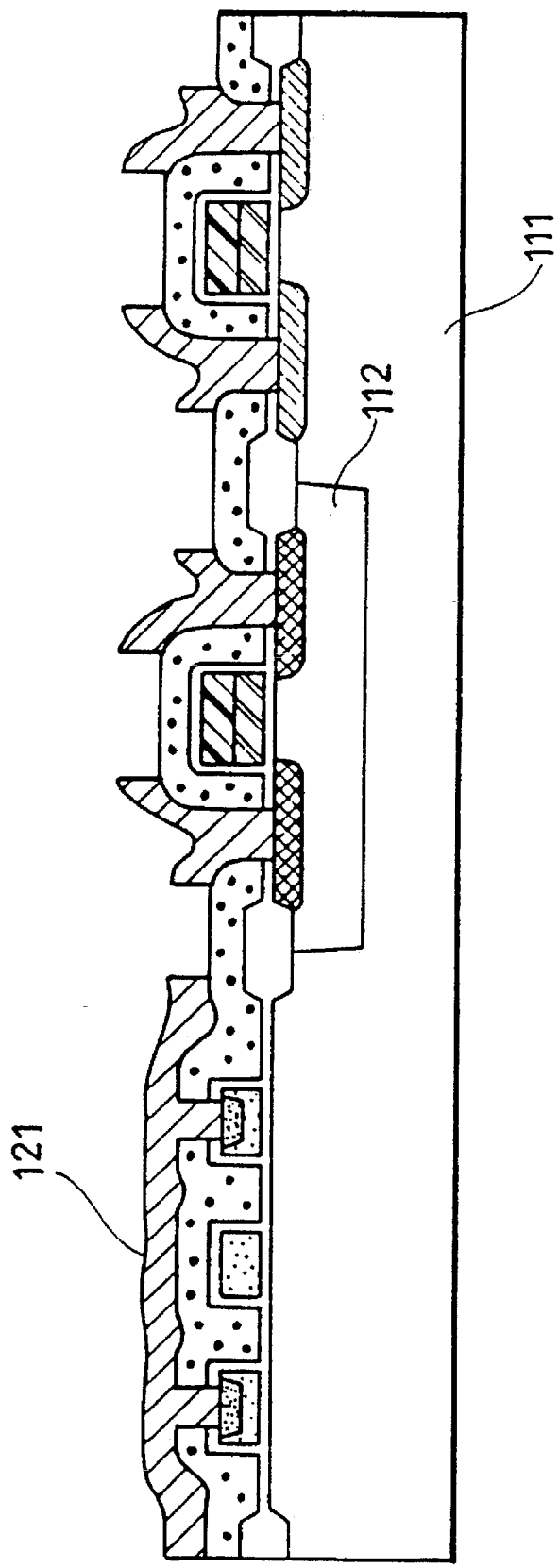
FIG. 15 is a sectional view of a mask ROM using a PN junction as a memory cell showing still further manufacturing steps of the manufacturing method.

FIG. 11 shows a sectional view of a region corresponding to the region where one memory cell having a tunnel oxide film is to be formed. According to the second method, a contact hole is provided in oxide film 113 so that N type impurity diffusion layer 122 which is a word line is exposed (refer to FIGS. 11(a) and (b)). Next, the surface of the exposed N type diffusion layer 122 and the surface of the oxide film 113 are thinly oxidized, as shown in FIG. 11(c). Thus, a thin oxide film 123 having a thickness that can generate tunnel phenomenon is provided only in the portion in N type diffusion layer 122 where an opening is provided.

FIG. 18A is a sectional view of an arbitrary memory cell in a mask ROM according to another embodiment of the present invention. FIG. 18B is a plan view and a sectional view of a structure of a memory cell array in a mask ROM of the present embodiment.

Referring to FIG. 18A, a memory cell in a mask ROM of the present embodiment includes a first conductive layer 12 formed of an N type impurity diffusion layer on a semiconductor substrate 11 of P⁻ type, an insulation film 14 such as of silicon oxide on conductive layer 12, and a second conductive layer 13 such as of metal, or polysilicon, or a combination thereof, on insulation film 14. The thickness of insulation film 14 on N type impurity diffusion layer 12 is thin enough so that electrons move from conductive layer 13 to N type impurity diffusion layer 12 via insulation film 14 responsive to application of high voltage to conductive layer 13, i.e. to generate tunnel phenomenon. This portion having such film thickness (the portion enclosed by broken lines in the figure) is called the tunnel oxide film. The thickness of the tunnel oxide film in each memory cell is set according to the data to be stored in that memory cell.

Figure 19:
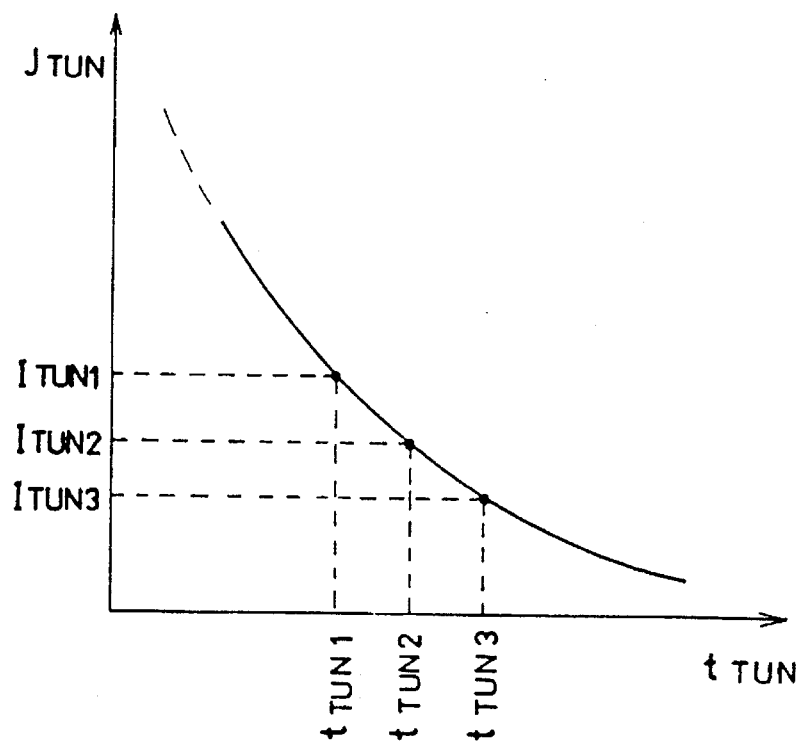
FIG. 19 is a diagram for explaining the operation of a memory cell in a mask ROM of the another embodiment.
Figure 20:
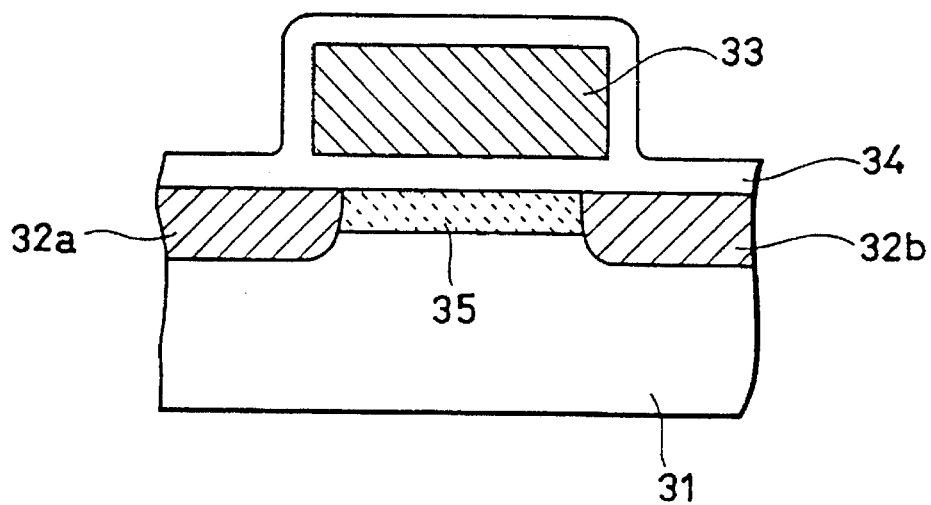
FIG. 20 is a sectional view of a memory cell in a conventional multi-value memory where one MOS transistor is used as one memory cell.
Figure 21:
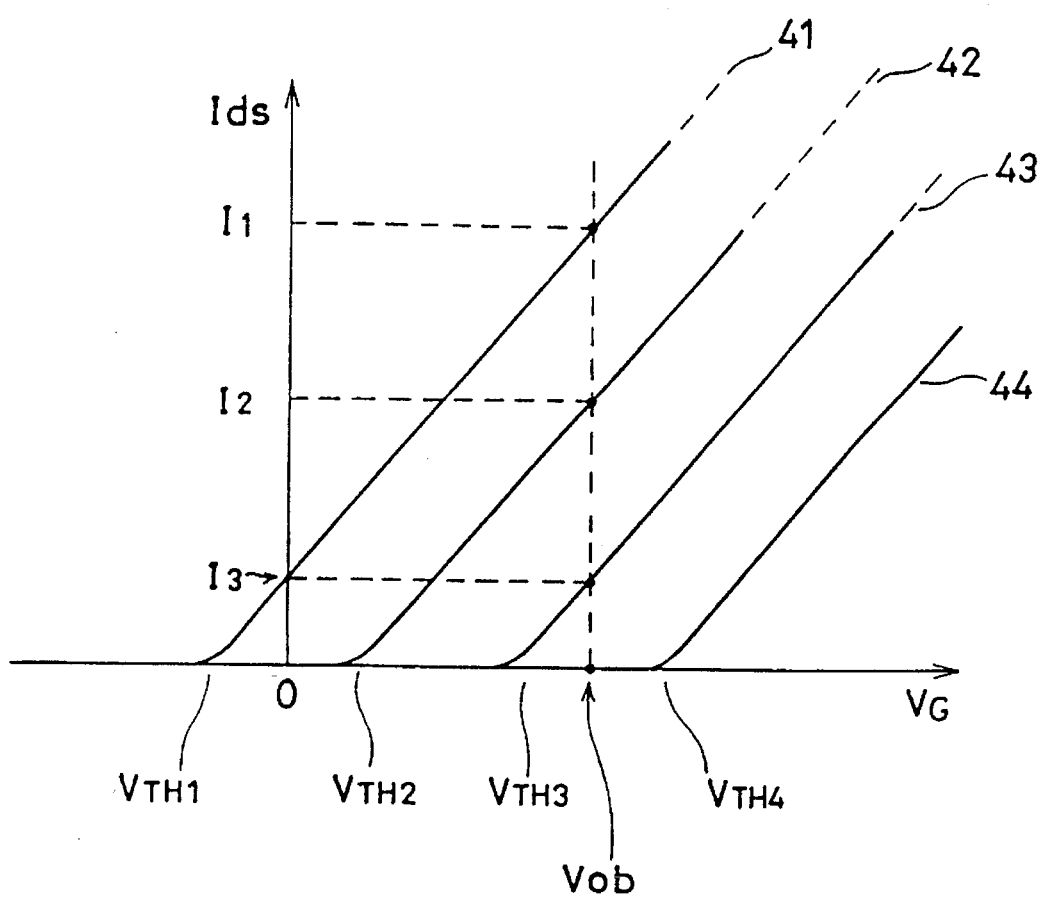
FIG. 21 is a diagram for explaining the operation of the memory cell shown in FIG. 20.
Figure 22A:
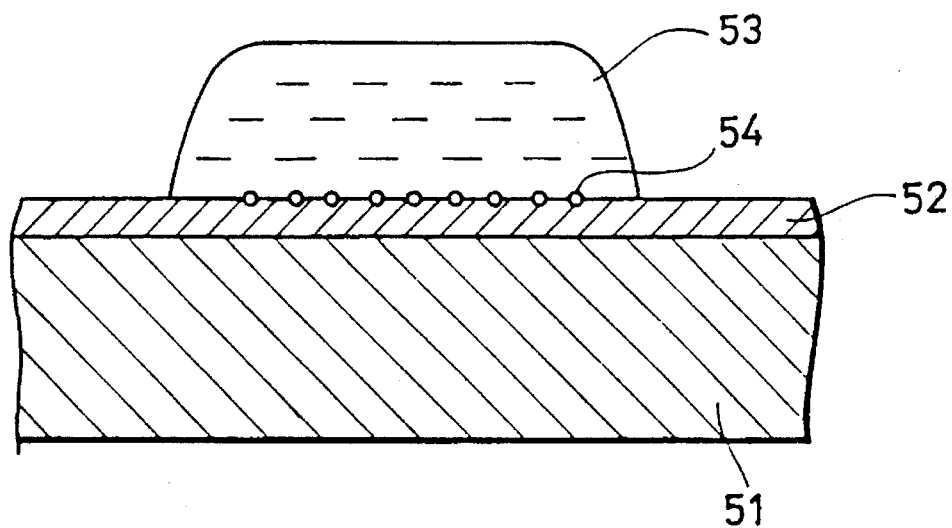
FIGS. 22A and 22B are a sectional view of a memory cell and a plan view of a memory cell array in a conventional multi-value memory utilizing non-elastic tunnel effect.
Figure 22B:
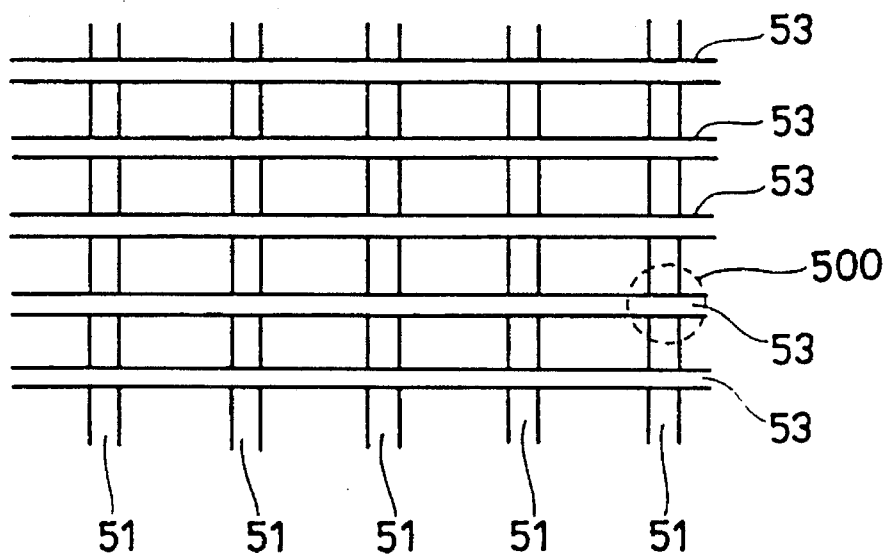
Figure 23:
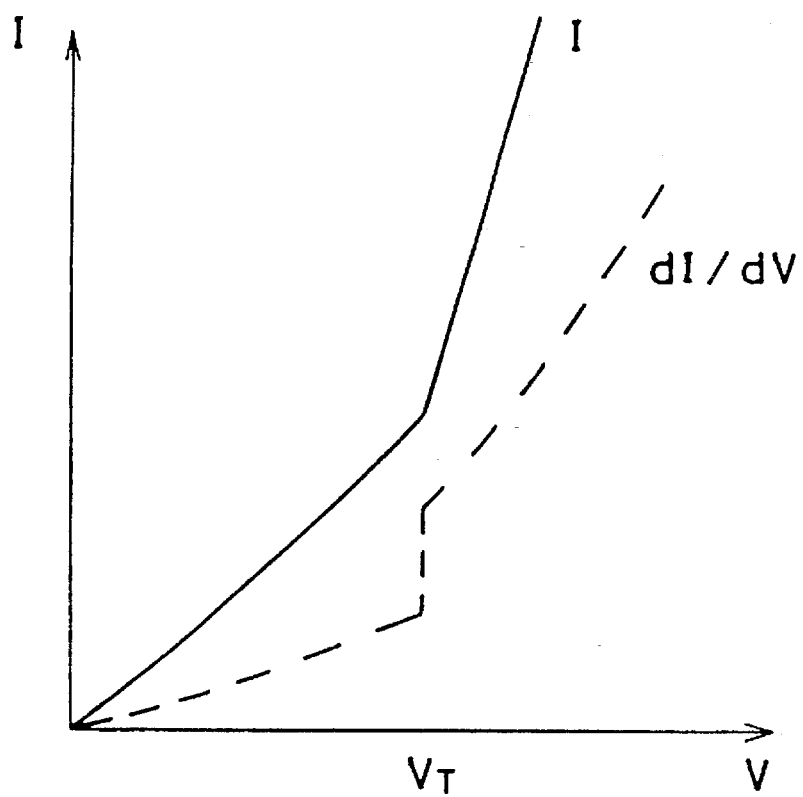
FIG. 23 is a diagram for explaining the operation of each memory cell in a conventional multi-value memory utilizing non-elastic tunnel effect.

The operation of a memory cell in the mask ROM of the present embodiment will first be explained with reference to FIG. 19. FIG. 19 is a graph showing the relationship between film thickness $t_{TUN}$ of tunnel oxide film 15, and current (referred to as tunnel current hereinafter) $J_{TUN}$ flowing across conductive layers 12 and 13 due to tunnel phenomenon when a constant high voltage is applied between conductive layers 12 and 13.

Tunnel current is described in, for example, "Analysis and Modelling of Floating-gate EEPROM Cells" (IEEE TRANSACTIONS ON ELECTRON DEVICES, VOL. ED-33, NO. 6, JUNE 1986, pp. 835–844).

According to the above document, the magnitude of current $J_{TUN}$ flowing between conductive layers 12 and 13 via a tunnel oxide film 15 when electric field of $E_{TUN}$ is applied between conductive layers 12 and 13 is represented by the following equation:

$$J_{TUN} = \alpha E_{TUN}^2 \cdot \exp\left(-\frac{\beta}{E_{TUN}}\right) \quad (1)$$

where α and β both represent a constant. Electric field $E_{TUN}$ is expressed by the following equation using film thickness $t_{TUN}$ of tunnel oxide film 15 and applied voltage $V_{tun}$ towards conductive layer 13:

$$E_{TUN} = \frac{|V_{TUN}|}{t_{TUN}} \quad (2)$$

From the above equations of (1) and (2), the magnitude of tunnel current $J_{TUN}$ when voltage of $V_{TUN}$ is applied to conductive layer 13 can be obtained for each film thickness $t_{TUN}$ of tunnel oxide film. FIG. 19 shows the relationship between film thickness $t_{TUN}$ of tunnel oxide film 15 and tunnel current $J_{TUN}$ according to the above equations of (1) and (2).

It can be appreciated from FIG. 19 that tunnel current $J_{TUN}$ is hardly influenced by film thickness $t_{TUN}$ of the tunnel oxide film to take a considerably small value when film thickness $t_{TUN}$ of the tunnel oxide film is very thick. If film thickness $t_{TUN}$ is thin enough, tunnel current $J_{TUN}$ increases according to film thickness $t_{TUN}$ of tunnel oxide film 15. For example, when applied voltage $V_{TUN}$ towards conductive layer 13 is approximately 25 V, current $J_{TUN}$ flowing between conductive layers 12 and 13 via tunnel oxide film 15 having film thickness $t_{TUN}$ of 10 nm is approximately several tens μA. By applying a predetermined level of voltage to conductive layer 13 in memory cell and detecting the magnitude of the flowing tunnel current, the film thickness of tunnel oxide film 15 in that memory cell can be determined.

A plurality of bits of data can be stored in one memory cell by providing memory cells having three or more types of film thickness in tunnel oxide film 15. For example, it is assumed that three types of memory cells having different film thicknesses of tunnel oxide film 15 are provided, each corresponding to three types of data. The stored data in a memory cell can be identified which of the aforementioned three types of data it represents by detecting the magnitude of tunnel current across conductive layers 12 and 13 of that memory cell when a predetermined voltage (for example, 25 V) is applied to the conductive layer 13 of the memory cell from which stored data is to be read out.

It is understood from FIG. 19 that tunnel current $J_{TUN}$ increases as film thickness $t_{TUN}$ of tunnel oxide film 15 becomes thinner when the voltage $V_{TUN}$ applied to conductive layer 13 is identical. By identifying which of tunnel current $I_{TUN1}$ flowing in the memory cell having tunnel oxide film 15 of the thinnest film thickness $t_{TUN1}$, tunnel current $I_{TUN3}$ flowing in the memory cell having tunnel oxide film 15 of the thickest film thickness $t_{TUN3}$, and tunnel current $I_{TUN2}$ flowing in the memory cell having oxide film 15 of an intermediate film thickness of $t_{TUN2}$ matches the detected tunnel current, the thickness of tunnel oxide film 15 of a desired memory cell, i.e. a stored data, can be read out.

The structure of a memory cell array in the mask ROM of the present embodiment will be explained hereinafter with reference to FIG. 18B. FIG. 18B shows the case where there are three types of data that can be stored in each memory cell.

The memory cell array includes a plurality of first conductive layers 12 formed in a strip-like manner on P⁻ semiconductor substrate 11, insulation film 14 formed all over semiconductor substrate 11 including the plurality of strips of first semiconductor layers 12, and a plurality of strips of second conductive layers 13 in parallel with each other formed on insulation film 14 to cross each of the plurality of first conductive layers 12 at right angles. The thickness of insulation film 14 at crossovers 100 of first conductive layers 12 and second conductive layers 13 is divided into three types of $t_{TUN1}$, $t_{TUN2}$, and $t_{TUN3}$ of FIG. 2 at the time of manufacturing. Each of crossovers 100 is used as one memory cell. FIG. 18A shows a sectional view of an arbitrary crossover 100.

The memory cell array includes a memory cell 100a having tunnel oxide film 15 of $t_{TUN1}$ film thickness, a memory cell 100b having tunnel oxide film 15 of $t_{TUN2}$ film thickness, and a memory cell 100c having tunnel oxide film 15 of $t_{TUN3}$ film thickness. In order to read out a stored data of a memory cell in the memory cell array, the potential of one of the plurality of first conductive layers 12 corresponding to that memory cell, and the potential of one of the plurality of second conductive layers 13 corresponding to that memory cell are set to a predetermined high potential (for example approximately 25 V) and 0 V, respectively, to detect the current flowing across the first and second conductive layers 12 and 13 corresponding to that memory cell as the tunnel current $J_{TUN}$.

Thus, according to the present invention, multi-bits of data can be stored in one memory cell utilizing the difference of tunnel current according to the film thickness of the tunnel oxide film. The tunnel oxide film 15 can be formed by conventional technology used in forming a memory cell of the manufacturing steps of an EEPROM (Electrically Erasable and Reprogrammable Read Only Memory) which is a readout exclusive memory device capable of electrical writing and erasing. Therefore, the memory cell array of the present embodiment can be realized by a relatively simple manufacturing step utilizing conventional manufacturing technology.

The occupying area of each memory cell on semiconductor substrate 11 is determined according to the width of first and second conductive layers 12 and 13. Therefore, each memory cell of this mask ROM can be more miniaturized than the memory cell of the field effect transistor type since the minimum occupying area depends upon the limited value of line-and-space of the current manufacturing technology.

According to the present embodiment, a memory cell array having a plurality of bits of data previously stored in each memory cell, that is advantageous to increase integration density of memory cells on the chip, can be obtained by relatively simple manufacturing steps. The amount of information that can be stored in an identical area in a semiconductor memory device can be increased drastically by applying conventional manufacturing technology to realize a mask ROM of high capacity.

Although the above embodiment was described in which first conductive layer 12, second conductive layer 13, and insulation film 14 were formed on a P⁻ type semiconductor substrate, similar effect can be obtained when they are formed on an N⁻ type semiconductor substrate. First conductive layer 12, second conductive layer 13, and insulation film 14 are not limited to the above described impurity diffusion layer, metal and polysilicon, and silicon oxide, respectively, and may be formed of other materials as long as data readout is possible under the above described principle.

Although the tunnel oxide film of the memory cell had three types of film thicknesses in the memory cell array of the above embodiments, similar effects can be obtained even when four or more types of film thicknesses of the tunnel oxide film for the memory cell are provided.

The specific values of the voltages, currents, etc. indicated in the description of the above embodiments are standard values obtained according to current manufacturing technology and experimental data and the like. They may change according to various conditions in practice.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a mask ROM having data stored in advance at the time of manufacturing, said method comprising the steps of:

forming a plurality of first strip conductive layers laterally spaced on a the main surface of a semiconductor substrate, forming an insulation film on said plurality of first strip conductive layers, forming a plurality of second strip conductive layers laterally spaced on said insulation film to cross each of said plurality of first strip conductive layers, wherein said step of forming an insulation film comprises the step of forming each location of said insulation film corresponding to the crossings of said plurality of first strip conductive layers and said plurality of second strip conductive layers to a thickness that can generate or not generate tunnel phenomenon according to said data stored in said mask ROM.

2. The method of manufacturing a mask ROM according to claim 1, wherein said step of forming a plurality of first strip conductive layers comprises the step of implanting impurities of a polarity opposite to that of said semiconductor substrate into said main surface of said semiconductor substrate, said step of forming an insulation film comprises the step of forming a silicon oxide film by selective local oxidation on said plurality of first strip conductive layers, and said step of forming a plurality of second strip conductive layers comprises the step of forming at least one of a polycrystal silicon layer and a metal layer on said silicon oxide film.

3. The method of manufacturing a mask ROM according to claim 1, wherein said step of forming each location of said insulation film comprises the step of etching any of the location of said formed silicon oxide film corresponding to said crossing to a thickness that can generate said tunnel phenomenon.

4. The method of manufacturing a mask ROM according to claim 1, wherein said step of forming each location of said insulation film comprises the steps of providing a plurality of openings in any of the locations corresponding to said crossing in said formed silicon oxide film to expose a corresponding one of said plurality of first strip conductive layers, and oxidizing the surface of said exposed portion of said plurality of first strip conductive layers.

5. A method of manufacturing a mask ROM having data stored in advance at the time of manufacturing, said method of manufacturing comprising the steps of:

forming an insulation film on a main surface of a semiconductor substrate, forming a plurality of first strip conductive layers laterally spaced by selectively implanting impurities onto said main surface of said semiconductor substrate via said insulation film, and forming a plurality of second strip conductive layers laterally spaced on said insulation film to cross each of said plurality of first strip conductive layers, wherein said step of forming an insulation film further comprises the step of:

forming each location of said insulation film corresponding to the crossings of said plurality of first strip conductive layers and said plurality of second strip conductive layers to a thickness that generates or not generates tunnel phenomenon according to said data stored in said mask ROM.

6. The method of manufacturing a mask ROM according to claim 5, wherein said step of forming said insulation film comprises the step of forming a silicon oxide film on said main surface by selective local oxidation, and p1 said step of forming said plurality of second strip conductive layers comprises the step of forming at least one of a polycrystal silicon layer and a metal layer on said silicon oxide film.

7. The method of manufacturing a mask ROM according to claim 6, wherein said step of forming each portion of said insulation film comprises the step of etching any of the locations of said formed silicon oxide film corresponding to said crossings to a thickness that can generate said tunnel phenomenon.

8. The method of manufacturing a mask ROM according to claim 6, wherein said step of forming each location of said insulation film comprises the steps of providing a plurality of openings in a portion of said formed silicon oxide film so that any of said plurality of first strip conductive layers is exposed, and oxidizing said exposed portion of said plurality of first strip conductive layers.

9. A method of manufacturing a mask ROM including a memory cell array having data stored in advance at the time of manufacturing, and a peripheral circuit for driving said memory cell array, said peripheral circuit including transistor means having a gate region, a source region and a drain region, said method comprising the steps of:

forming an oxide film including an element isolation region on a main surface of a semiconductor substrate, said main surface comprising a first region in which said memory cell array is to be formed, and a second region in which said peripheral circuit is to be formed, forming a first conductive layer as said gate region in said second region excluding said element isolation region of said formed oxide film, forming an impurity region by implanting impurities via said formed oxide film into said first region and said second region excluding said element isolation region of said formed oxide film, said formed impurity region forming a plurality of first strip conductive layers in said first region and forming said source region and said drain region in said second region, providing a contact hole in a location overlying said impurity region in said second region, and forming a second conductive layer on said formed oxide film of said first region and in said provided contact hole, said second conductive layer forming a plurality of second strip conductive layers in said first region crossing each of said plurality of first strip conductive layers, and forming interconnection layer in said second region, and forming each portion of said oxide film corresponding to the crossings of said plurality of first strip conductive layers and said plurality of second strip conductive layers to a thickness that generates or not generates said tunnel phenomenon according to said data stored in said mask ROM prior to the formation of said impurity region.

10. A method of manufacturing a mask ROM including a memory cell array having data stored in advance at the time of manufacturing, and a peripheral circuit for driving said memory cell array, said peripheral circuit including transistor means having a gate region, a source region and a drain region, said method comprising the steps of:

forming an oxide film including an element isolation region on a main surface of a semiconductor substrate, said main surface comprising a first region in which said memory cell array is to be formed, and a second region in which said peripheral circuit is to be formed, forming an impurity region by implanting impurities into said main surface via said formed oxide film in said first region excluding said element isolation region of said formed oxide film, said impurity region forming a plurality of first strip conductive layers, forming a first conductive layer in said first region and said second region excluding said element isolation region of said formed oxide film, said first conductive layer forming a plurality of second strip conductive layers in said first region crossing each of said plurality of first strip conductive layers, and forming said gate region in said second region, forming said source region and said drain region by implanting impurities into said main surface excluding said element isolation region of said formed oxide film in said second region, forming an insulation film on said first region and said second region, providing a plurality of contact holes at locations corresponding to said plurality of second strip conductive layers of said formed insulation film and at portions corresponding to said source region and said drain region, forming a second conductive layer as an interconnection layer within said provided plurality of contact holes, and forming each portion of said oxide film corresponding to the crossings of said plurality of first strip conductive layers and said plurality of second strip conductive layers to a thickness that can generate or not generate tunnel phenomenon according to said data stored in said mask ROM, prior to the formation of said impurity region.

11. The method of manufacturing a mask ROM according to claim 9, wherein said step of forming each portion of said oxide film comprises the steps of providing a plurality of openings in any of the locations corresponding to said crossings in said oxide film so that a corresponding one of said plurality of first strip conductive layers is exposed, and oxidizing the surface of said exposed portion of said plurality of first strip conductive layers.

12. The method of manufacturing a mask ROM according to claim 9, wherein said step of forming each location of said oxide film comprises the step of etching any of a portion corresponding to said crossings of said oxide film to a thickness that can generate said tunnel phenomenon.

13. The method of manufacturing a mask ROM according to claim 10, wherein said step of forming each portion of said oxide film comprises the steps of providing a plurality of openings in any of the locations corresponding to said crossings in said oxide film so that a corresponding one of said plurality of first strip conductive layers is exposed, and oxidizing the surface of said exposed portion of said plurality of first strip conductive layers.

14. The method of manufacturing a mask ROM according to claim 10, wherein said step of forming each location of said oxide film comprises the step of etching any of a portion corresponding to said crossings of said oxide film to a thickness that can generate said tunnel phenomenon.

* * * * *